United States Patent
Kanskar et al.

(10) Patent No.: US 11,495,942 B2
(45) Date of Patent: *Nov. 8, 2022

(54) METHOD, SYSTEM AND APPARATUS FOR HIGHER ORDER MODE SUPPRESSION

(71) Applicant: NLIGHT, INC., Vancouver, WA (US)

(72) Inventors: Manoj Kanskar, Portland, OR (US); Zhigang Chen, Portland, OR (US); Nicolas Biekert, Vancouver, WA (US)

(73) Assignee: NLIGHT, INC., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/993,193

(22) Filed: Aug. 13, 2020

(65) Prior Publication Data
US 2020/0373736 A1    Nov. 26, 2020

Related U.S. Application Data

(63) Continuation-in-part of application No. 15/796,355, filed on Oct. 27, 2017, now Pat. No. 10,777,968.
(Continued)

(51) Int. Cl.
*H01S 5/065* (2006.01)
*H01S 5/22* (2006.01)
*H01S 5/20* (2006.01)

(52) U.S. Cl.
CPC .......... *H01S 5/0654* (2013.01); *H01S 5/2018* (2013.01); *H01S 5/22* (2013.01)

(58) Field of Classification Search
CPC ........ H01S 5/0654; H01S 5/22; H01S 5/2018; H01S 2301/166; H01S 5/04256;
(Continued)

(56) References Cited

U.S. PATENT DOCUMENTS

| 5,631,916 A | 5/1997 | Georges et al. |
| 9,214,786 B2 | 12/2015 | Hemenway et al. |

(Continued)

FOREIGN PATENT DOCUMENTS

| IT | 0001426562 | 12/2016 |
| WO | 9101056 | 1/1991 |

(Continued)

OTHER PUBLICATIONS

Federal Institute of IP (International Search Authority Russia); International Search Report and Written Opinion for PCT/US2020/046251; dated Oct. 29, 2020; 7 pages.

*Primary Examiner* — Xinning(Tom) Niu

(57) ABSTRACT

A laser diode, comprising a transverse waveguide that is orthogonal to the lateral waveguide comprising an active layer between an n-type waveguide layer and a p-type waveguide layer, wherein the transverse waveguide is bounded by an n-type cladding layer on an n-side and p-type cladding layer on a p-side and a lateral waveguide bounded in a longitudinal direction at a first end by a high reflector (HR) coated facet and at a second end by a partial reflector (PR) coated facet, the lateral waveguide further comprising a buried higher order mode suppression layer (HOMSL) disposed beneath the p-cladding within the lateral waveguide or on one or both sides of the lateral waveguide or a combination thereof, wherein the HOMSL extends in a longitudinal direction from the HR facet a length less than the distance between the HR facet and the PR facet.

16 Claims, 18 Drawing Sheets

Related U.S. Application Data

(60) Provisional application No. 62/414,377, filed on Oct. 28, 2016, provisional application No. 62/885,946, filed on Aug. 13, 2019.

(58) Field of Classification Search
CPC .... H01S 5/1064; H01S 5/2022; H01S 5/2036; H01S 5/04254; H01S 5/0287
See application file for complete search history.

(56) References Cited

U.S. PATENT DOCUMENTS

| | | | |
|---|---|---|---|
| 9,647,416 B2 | 5/2017 | Demir et al. | |
| 10,777,968 B2 * | 9/2020 | Kanskar | ................ H01S 5/2036 |
| 2003/0128729 A1 * | 7/2003 | Matsumura | ............ H01S 5/227 |
| | | | 372/46.01 |
| 2006/0193353 A1 | 8/2006 | Kim | |
| 2009/0097511 A1 | 4/2009 | Mohrdiek et al. | |
| 2012/0002395 A1 | 1/2012 | Du et al. | |
| 2014/0219305 A1 | 8/2014 | Fang | |
| 2014/0301421 A1 | 10/2014 | Kanskar | |
| 2016/0344160 A1 | 11/2016 | Muller | |
| 2018/0035877 A1 | 2/2018 | Kinouchi et al. | |
| 2018/0123317 A1 | 5/2018 | Kanskar | |

FOREIGN PATENT DOCUMENTS

| | | |
|---|---|---|
| WO | 2006105249 | 10/2006 |
| WO | 2007004726 | 1/2007 |
| WO | 2011108038 | 9/2011 |
| WO | 2012050132 | 8/2012 |
| WO | 2018081602 | 5/2018 |
| WO | 2021/030639 | 2/2021 |

* cited by examiner

METHOD, SYSTEM AND APPARATUS FOR HIGHER ORDER MODE SUPPRESSION

CROSS REFERENCE TO RELATED APPLICATION

This application is a continuation-in-part of U.S. patent application Ser. No. 15/796,355, filed Oct. 27, 2017, which claims the benefit of U.S. Provisional Patent Application No. 62/414,377, filed Oct. 28, 2016 and which further claims the benefit of U.S. Provisional Patent Application No. 62/885,946, filed Aug. 13, 2019, all of which are incorporated by reference herein in their entirety.

TECHNICAL FIELD

The technology disclosed herein relates to diode lasers, more particularly to methods, systems and apparatus for suppressing higher order modes in diode lasers.

BACKGROUND

Lasers are light emitting devices. Light emission in a laser occurs as a result of optical amplification by stimulated emission of electromagnetic radiation. Some lasers emit spatially and temporally coherent light which allows lasers to emit light in a narrow light bandwidth that can be narrowly focused over long distances. There are a wide variety of lasers, for example, gas lasers, chemical lasers, dye lasers, metal-vapor lasers, solid-state lasers, and semiconductor lasers. Laser diodes are electrically pumped semiconductor lasers, in which an active layer is formed by a p-n junction of a semiconductor diode. Laser diodes typically comprise an active layer disposed between a p-type layer of semiconductor material and an n-type layer of semiconductor material. Many laser diodes are fabricated on a semiconductor substrate such as gallium arsenide, doped with elements such as aluminum, silicon, zinc, carbon or selenium to produce the n- and p-type semiconductor layers. The active layer is typically un-doped gallium-indium-arsenide and may be only a few nanometers thick.

Laser diodes are formed by growing multiple layers of semiconductor materials on a suitable substrate with a lattice constant that allows choice of materials to produce desired emission wavelengths. A typical laser diode comprises n-type layers, p-type layers and an undoped active layer between them such that when the diode is forward-biased, electrons and holes recombine in the active region layer to produce light. The active layer (quantum well(s), quantum wire(s) or quantum dots, type-II quantum well(s)) resides in a waveguide layer which has a higher index of refraction compared to the surrounding p- and n-doped cladding layers. Light generated from the active layer is confined in the plane of the waveguide.

A conventional edge-emitting Fabry Perot broad area laser diode is arranged as a rectangular gain or index-guided semiconductor structure. Opposing end facets of the waveguide define high and partial reflectors to provide feedback for oscillation of light within the resonator. The multi-layered laser diode structure extends the length of the laser and has a broad width for electrical injection extending to opposite side surfaces which also extend the length of the laser. The multi-layered semiconductor materials are typically arranged so that the laser operates in a single mode along the growth direction of the laser and this direction is defined as the fast-axis direction. Since along the fast-axis direction the semiconductor laser operates in a single mode, the brightness of a laser diode in this direction cannot be improved any further; it is so called diffraction-limited. The distance between the top and bottom surfaces of the multi-layered semiconductor laser structure thus provides the smaller dimension of the end facets, i.e., the thickness of the stripe, typically on the order of microns. On the other hand, the width of the multi-layered laser structure provides the larger dimension of the end facets, i.e., the stripe-width, typically on the order of many tens of microns to hundreds of microns. This is referred to as the "slow axis." Because the stripe width is much larger than the wavelength of light, the lateral property of an optical field propagating along the optical axis of the waveguide is highly multimode along the wider stripe dimension and the corresponding axis is described as slow-axis because the divergence angle is much smaller relative to the fast-axis divergence angle.

"Multimode laser diodes" or "broad area lasers" (BALs) are used in high power applications. BALs have multiple modes in the slow axis, so that their slow-axis beam-parameter-product (BPP) is higher than that of single-mode laser diodes. Furthermore, as they are driven to higher currents, the thermal lensing becomes more pronounced which causes higher index contrast profile in the lateral direction leading to accommodation of an increasing number of lateral modes. Consequently, as the lateral divergence angle widens this leads to degradation in lateral BPP and brightness (power÷BPP) and concurrently reduction in the slow-axis brightness. This means that even though power typically scales up with higher current, slow-axis brightness will degrade. Brightness can be improved in BALs by reducing the emitter width; however, the current at which the maximum brightness occurs also happens at progressively lower current values. Hence, the maximum output power at the maximum brightness also drops.

For power-scaling applications and reducing the cost-per-watt of producing diode lasers, higher brightness at higher output power per emitter is desirable.

SUMMARY

Disclosed here are methods, systems and apparatuses for reducing the magnitude of the refractive index contrast of a lateral waveguide during operation of a laser diode. This may include a laser diode having a transverse waveguide that is orthogonal to the lateral waveguide comprising an active layer between an n-type waveguide layer and a p-type waveguide layer, wherein the transverse waveguide is bounded by an n-type cladding layer on an n-side and p-type cladding layer on a p-side and a lateral waveguide bounded in a longitudinal direction at a first end by a high reflector (HR) coated facet and at a second end by a partial reflector (PR) coated facet, the lateral waveguide further comprising a buried higher order mode suppression layer (HOMSL) disposed beneath the p-cladding within the lateral waveguide or on one or both sides of the lateral waveguide or a combination thereof, wherein the HOMSL extends in a longitudinal direction from the HR facet a length less than the distance between the HR facet and the PR facet.

A refractive index of the HOMSL disposed on one or both sides of the lateral waveguide may be higher than the p-type waveguide layer and the p-cladding layer in some examples.

A refractive index of the HOMSL disposed within the lateral waveguide may be lower than the n-type waveguide layer or the p-type waveguide layer or a combination thereof in some examples.

A thickness of the HOMSL may be selected based on a magnitude of the refractive index contrast in the lateral waveguide induced by thermal lensing within the lateral waveguide during operation of the laser diode. In examples, the thickness of the HOMSL is selected to reduce the magnitude of the refractive index contrast of the lateral waveguide during operation. The magnitude of the refractive index contrast may be in the range of $10^{-5} < \Delta n < 10^{-3}$. In some examples, such a lateral waveguide supports fewer than ten lateral modes or may support a single lateral mode.

In some examples, a thickness of the HOMSL may be selected to reduce an effective index on a side of the lateral waveguide extending from the HR facet. In some examples, such a lateral waveguide is bounded in the lateral direction by a ridge waveguide wherein the ridge waveguide extends from the HR facet to the PR facet.

In some examples, the HOMSL laterally overlaps the lateral waveguide by between 0-10 um on either side, or 0-20 um total.

In some examples, the HOMSL that is disposed within the lateral waveguide is narrower laterally than the lateral waveguide by 0-10 um on either side or 0-20 um total.

In some examples, the lateral waveguide is bounded in the lateral direction by a ridge waveguide in the longitudinal direction from the PR facet a length less than the distance between the PR facet and the HR facet.

In some examples, the HOMSL comprises a reduced transverse waveguide thickness in the active stripe and may be formed by either etching down or selectively depositing thicker layers adjacent to the active stripe.

In some examples, the HOMSL comprises gallium arsenide (GaAs), aluminum gallium arsenide (AlGaAs), indium gallium arsenide (InGaAs), indium aluminum gallium arsenide (InAlGaAs), indium gallium phosphide (InGaAsP).

In examples where the HOMSL is a thinner low index layer is may be formed of AlGaAs along the width of the lateral waveguide in the HOMSL region.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

DETAILED DESCRIPTION

Figure 1:
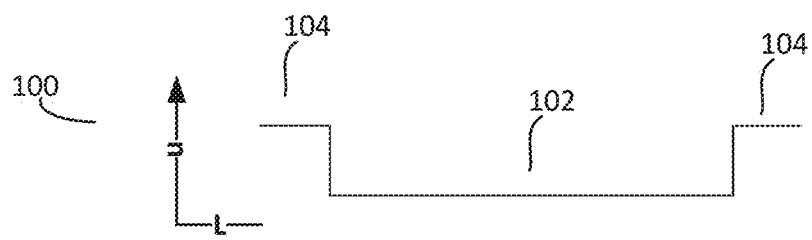
FIG. 1 depicts a lateral effective index profile for an example laser diode with a higher order mode suppression layer disposed adjacent a lateral waveguide.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed technology. These terms are high-level abstractions of the actual operations that are performed. The actual operations that correspond to these terms will vary depending on the particular implementation and are readily discernible by one of ordinary skill in the art.

In some examples, values, procedures, or apparatus' may be referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

As discussed above, it is desirable to efficiently scale power and improve brightness in BALs while minimizing output power penalties. Described herein are methods, systems and apparatus to target higher brightness at higher output power, by reducing slow axis divergence angle without reducing emitter width. The aim is to suppress the higher order modes in the slow axis while conserving lower order lasing modes.

Higher Order Mode Suppression Layer (HOMSL)

What is needed to overcome the shortcomings of conventional laser diodes discussed above in the Background is a laser diode that is configured to suppress higher order modes in the lateral direction (i.e., orthogonal to the propagation direction) while conserving lower order mode light. This can be accomplished by juxtaposing higher order mode suppressing structures adjacent to the lateral waveguide of the laser diode. Higher order mode suppressing structures may include a variety of materials and may be index guiding structures, anti-wave guiding structures, and/or high loss structures.

In one example, a higher order mode suppression layer (HOMSL) may be disposed adjacent to the lateral waveguide at or near the rear facet and extending less than the full-length of the waveguide along the longitudinal direction. HOMSL may comprise: index guiding structures, anti-wave guiding structures and/or high loss structures. For example, the index guiding, anti-waveguiding, and/or high loss structures may extend up to 20% or in another example between about 5%-50% of the length of the waveguide measured from the rear facet. Extending the HOMSL only a short distance along the longitudinal direction minimizes loss for the unsuppressed modes of the laser diode and enables the diode to operate more efficiently than if a HOMSL structure were to extend the entire length.

In another example, HOMSL may be disposed adjacent to a flared laser oscillator waveguide either extending a full longitudinal length of the waveguide or a partial longitudinal length of the waveguide as measured from the rear facet. By assembling the diode in this way the benefit of reducing higher order modes by suppressing them using HOMSL can be compounded with the benefits of using a flared laser oscillator waveguide (FLOW) as described in U.S. Pat. No. 9,166,369, which is incorporated herein by reference.

In yet another example, a laser diode can include a buried aperiodic high- and low-index structure with high loss in the high index material disposed adjacent to the waveguide along the longitudinal direction. The aperiodic structure may suppress higher order modes by disproportionately overlapping higher order modes compared to lower order modes and/or the fundamental mode. The aperiodic structures are selected to introduce high loss to higher order modes but minimize loss to lower order modes and/or fundamental mode. The aperiodic structure may be disposed along an entire length of the waveguide along the longitudinal direction or a shorter length extending from the rear facet. The aperiodic structure may also be disposed along the longitudinal direction of a broad area laser (BAL) and/or a flared laser oscillating waveguide.

FIG. 1 depicts an index profile 100 showing the relative index of refraction for an example lateral waveguide with adjacent HOMSL. Section 102 of index profile 100 represents the relative index of refraction of the lateral waveguide versus sections 104 representing the relative index of refraction of the adjacent HOMSL.

In an example, the HOMSL is an anti-wave guiding structure comprising a variety of materials having an index of refraction that is higher than the index of refraction of the waveguide. The HOMSL may comprise a variety of doped or undoped materials. The HOMSL material may be judiciously chosen to optimize efficiency versus BPP at the laser operating condition. Some examples of anti-wave guiding HOMSL materials when the native waveguide comprises aluminum gallium arsenide (AlGaAs) include doped gallium arsenide (GaAs), indium gallium arsenide (InGaAs), or the like or combinations thereof. Other combinations of materials forming the waveguide and anti-waveguiding structures will occur to those skilled in the art and claimed subject matter is not limited in this regard.

Figure 2:
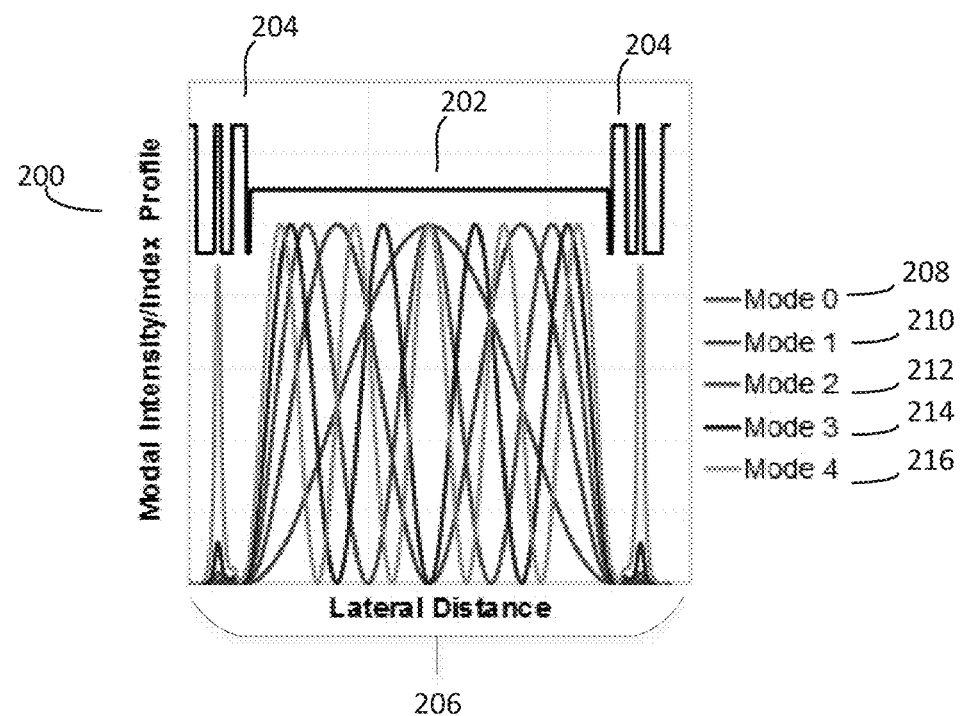
FIG. 2 depicts a lateral index profile and modal modeling for an example laser diode with a higher order mode suppression layer disposed adjacent the lateral waveguide.

FIG. 2 depicts an index profile 200 showing the relative index of refraction for an example lateral waveguide with a HOMSL disposed adjacent to the lateral waveguide and modal modeling for the first several lateral waveguide modes. Section 202 of index profile 200 represents the relative index of refraction of the lateral waveguide versus sections 204 representing the relative indices of refraction of the HOMSL. In an example, the HOMSL is an index guiding aperiodic structure comprising high- and low-index materials with high loss in the high index material which disproportionately overlaps higher order modes compared to lower order/fundamental modes. In an example, the low-index material has an index of refraction that is lower than the effective index of refraction of the lateral waveguide and the high-index material has an index of refraction that is higher than the effective index of refraction of the lateral waveguide. Sections 204 show the relative indices of the aperiodic structure with high and low index materials. The average index of refraction of the HOMSL may be lower than the modal index, so that the HOMSL is in the index guiding regime instead of anti-guiding, but the locally high index areas pull in the electric field or intensity and interacts with the material locally and introduce high loss to the higher order modes. Modal modeling 206 illustrates modal behavior of modes 0-4. The higher the modal number, the more overlap the mode has with the high-index region of the HOMSL, hence higher loss in the higher order modes versus the lower order modes (210-216)/fundamental mode (208).

Examples in FIGS. 3-26 depict examples of quantum well lasers for simplicity and illustrative purposes. However, various other laser types may be configured to include HOMSL features such as double heterostructure lasers, interband cascade lasers, distributed Bragg reflector lasers, distributed feedback lasers, quantum cascade lasers, vertical cavity surface emitting lasers and/or vertical external cavity surface emitting lasers, to name a few. Therefore, claimed subject matter is not limited to quantum well laser diodes.

Figure 3:
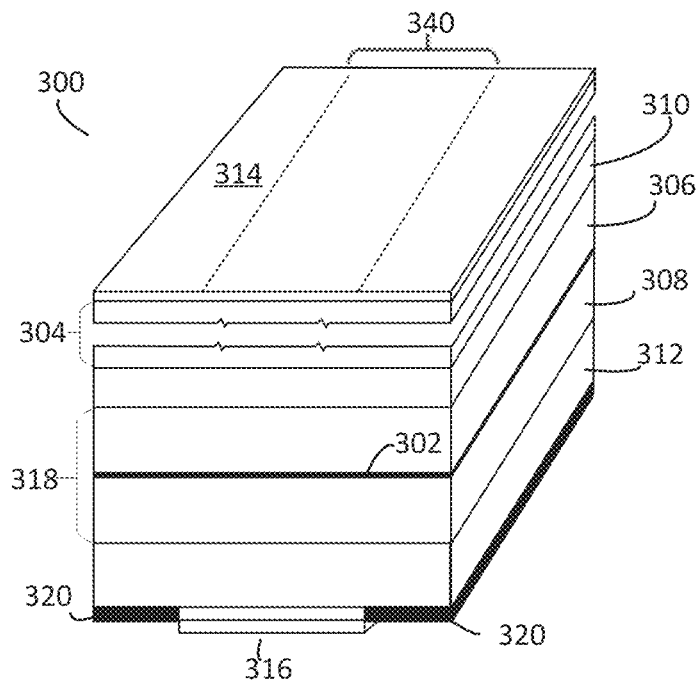
FIG. 3 illustrates a cross-sectional perspective view depicting a vertical epitaxial layer structure of an example laser diode including a higher order mode suppression layer disposed adjacent to the lateral waveguide.

FIG. 3 illustrates a cross-sectional perspective view depicting a vertical epitaxial layer structure of an example laser diode including a higher order mode suppression layer disposed adjacent to the lateral waveguide. In an example, laser diode 300 is a quantum well laser.

In an example, laser diode 300 is fabricated to include a substrate 304, an n-type semiconductor layer 306 and a p-type semiconductor layer 308. Quantum well 302 resides between n-type semiconductor layer 306 and p-type semiconductor layer 308. An n-cladding layer 310 is disposed outside of n-type semiconductor layer 306. A p-cladding layer 312 is disposed outside of p-type semiconductor layer 308. N-metal contact 314 is disposed on n-substrate 304. P-metal contact 316 is positioned under p-cladding layer 312. Quantum well 302, n-type semiconductor layer 306 and p-type semiconductor layer 308 make-up the transverse waveguide 318 portion of laser diode 300. The boundary of the lateral waveguide 340 is illustrated by dotted lines extending along the longitudinal direction on n-metal contact 314.

Lateral beam size of the diode laser is determined by the width of the active region or the width of the lateral waveguide. Because the width of the waveguide in the lateral direction is significantly greater than the wavelength of light, many modes will be generated in the lateral direction. HOMSL 320 is disposed adjacent to lateral waveguide 340 along the longitudinal direction. Furthermore, in FIG. 3 HOMSL 320 is located between air and p-cladding layer 312 outside of transverse waveguide 318. However, it is not necessary for HOMSL 320 to be positioned there. HOMSL 320 may be located in a variety of positions in the epitaxial structure and claimed subject matter is not limited in this regard.

In an example, HOMSL 320 comprises high index material wherein the index of HOMSL 320 is higher than the index of lateral waveguide 340. HOMSL 320 is configured to introduce differentially more loss to higher order modes thereby suppressing them in the lateral (i.e., orthogonal to propagation) direction. Inclusion of this buried or surface high index material disproportionately anti-guides higher order modes that overlap with the high index material compared to lower order modes/fundamental mode.

A variety of well-known materials and methods may be used to fabricate laser diode 300. For example, substrate 304 may comprise gallium arsenide (GaAs). N-type semiconductor layer 306, p-type semiconductor layer 308, n-cladding 310, and/or p-cladding 312 may be grown on GaAs substrate 304 and comprise any of: Indium (In), Gallium (Ga), Aluminum (Al), Arsenic (As), Phosphorous (P), Gallium Arsenide (GaAs), Indium Phosphide (InP) or the like or any combinations thereof. N-type and p-type layers may be doped with doping agents to produce the desired n-type or p-type materials. Claimed subject matter is not limited in this regard.

The HOMSL 320 material may be absorbing materials so that it absorbs high order modes to optimize efficiency versus beam parameter product (BPP) at the operating condition. The HOMSL 320 material may be absorbing or non-absorbing.

Figure 4:
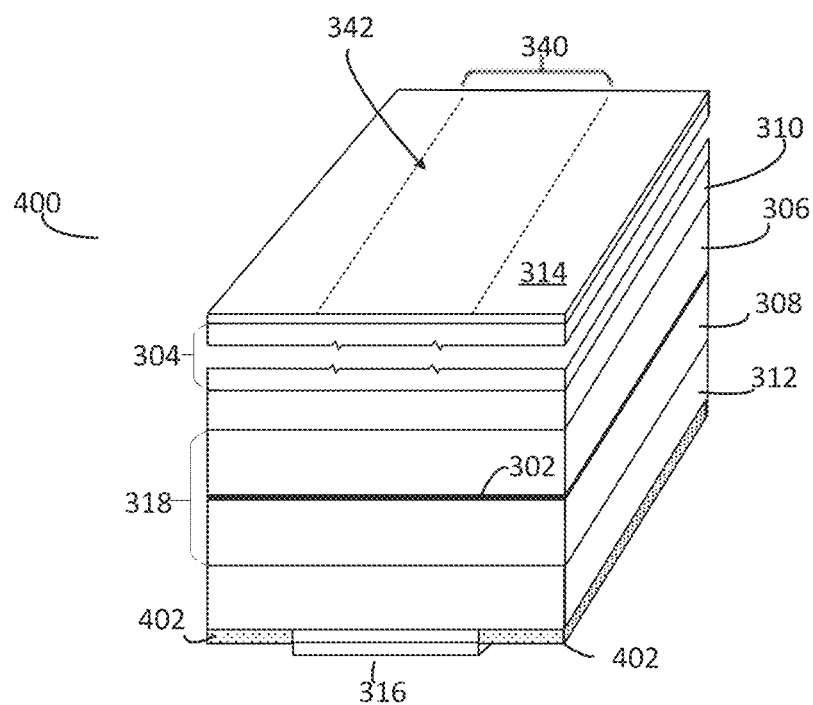
FIG. 4 illustrates a cross-sectional perspective view depicting a vertical epitaxial layer structure of an example laser diode including a higher order mode suppression layer disposed adjacent to the lateral waveguide.
Figure 5:
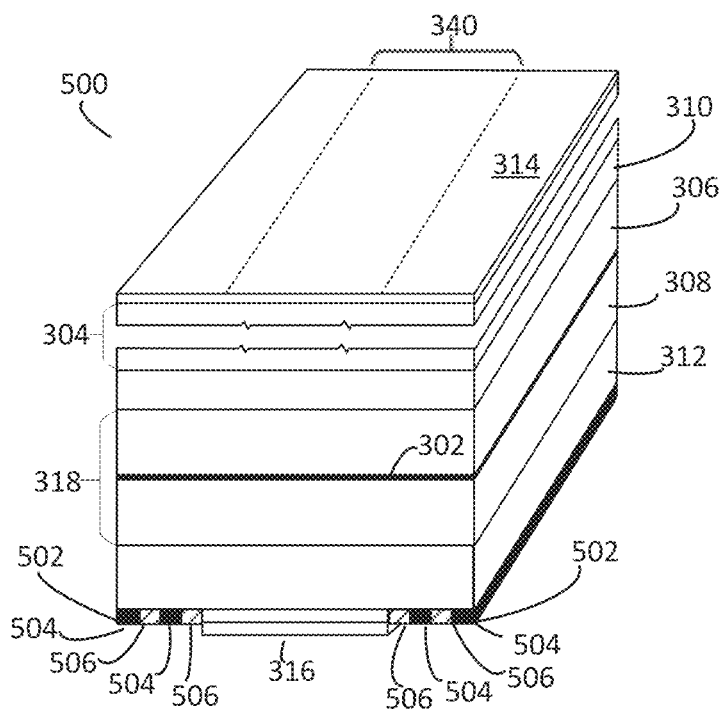
FIG. 5 illustrates a cross-sectional perspective view depicting a vertical epitaxial layer structure of an example laser diode including a higher order mode suppression layer disposed adjacent to the lateral waveguide.

FIG. 4 illustrates a cross-sectional perspective view depicting a vertical epitaxial layer structure of an example laser diode including a higher order mode suppression layer disposed adjacent to the lateral waveguide. In an example, laser diode 400 is a quantum well laser similar to the laser diode depicted in FIG. 3. However, laser diode 400 includes HOMSL 402 comprising an absorbing material. The absorbing material selected for HOMSL 402 may comprise semiconductor material like those mentioned above, metal (e.g., titanium (Ti) or nickel (Ni)) or semi-metal (e.g., tin (Sn) or As). HOMSL material 402 may be doped or un-doped. HOMSL 402 may be epitaxially grown or deposited on the surface of substrate 304 rather than buried. FIG. 5 illustrates a cross-sectional perspective view depicting a vertical epitaxial layer structure of an example laser diode including a higher order mode suppression layer disposed adjacent to the lateral waveguide. In an example, laser diode 500 is a quantum well laser similar to the laser diode depicted in FIG. 3. However, laser diode 500 includes HOMSL aperiodic structure 502 comprising high- and low-index materials. Low-index material 506 has a lower index of refraction than high-index material 504 and the effective index of the lateral waveguide 340. High-index material 504 and low-index material 506 may comprise the same materials doped differently to achieve different indexes of refraction or may comprise different materials altogether. For example, high-index material 504 may comprise deposited dielectric or semiconductor and low-index material may comprise air, dielectric or semiconductor materials.

In an example, low- and high-index materials are alternated extending outward from the sides of lateral waveguide 340. Low-index material 506 is disposed adjacent to lateral waveguide 340. The low-index material 506 is closer to lateral waveguide 340 than the high-index material 340. High-index material 504 is disposed outside of low index material 506. The pattern of high-index/low-index material may repeat several times aperiodically in the HOMSL structure 502. As noted above, the aperiodic structure of HOMSL 502 can have an average index of refraction that is lower than the modal effective index in the lateral waveguide or higher than the modal index of the lateral waveguide. The materials selected for the aperiodic structure of HOMSL 502 are chosen to introduce high loss to higher order modes but to minimize loss to lower order modes/fundamental mode.

Figure 6:
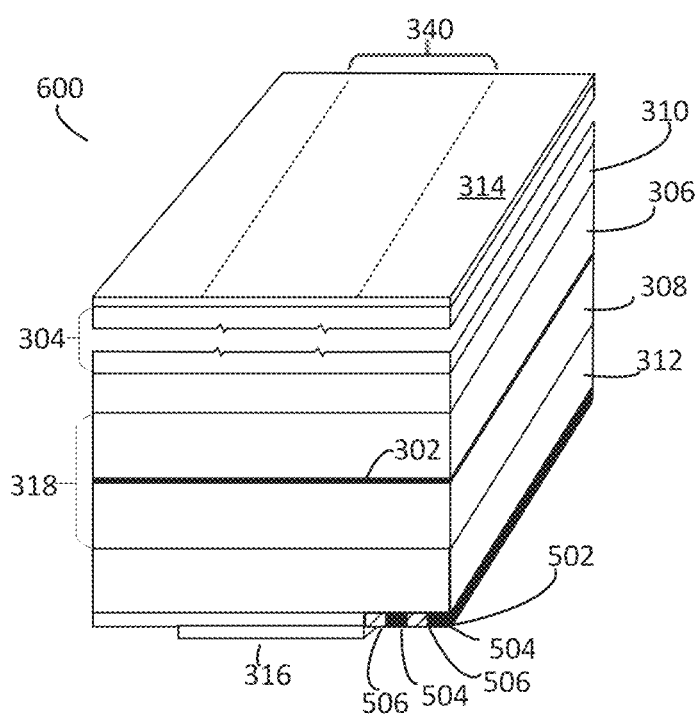
FIG. 6 illustrates a cross-sectional view depicting a vertical epitaxial layer structure of an example laser diode including a higher order mode suppression layer disposed adjacent to the lateral waveguide.

FIG. 6 illustrates a cross-sectional view depicting a vertical epitaxial layer structure of an example laser diode including a higher order mode suppression layer disposed adjacent to the lateral waveguide. In an example, laser diode 600 is a quantum well laser similar to the laser diode depicted in FIG. 5. However, laser diode 600 includes HOMSL 502 disposed on only one side of lateral waveguide 340. In an example, HOMSL 502 is configured to suppress higher order modes when distributed about waveguide 340 asymmetrically (as in this configuration) and/or where HOMSL structures are disposed symmetrically about waveguide 340.

Figure 7:
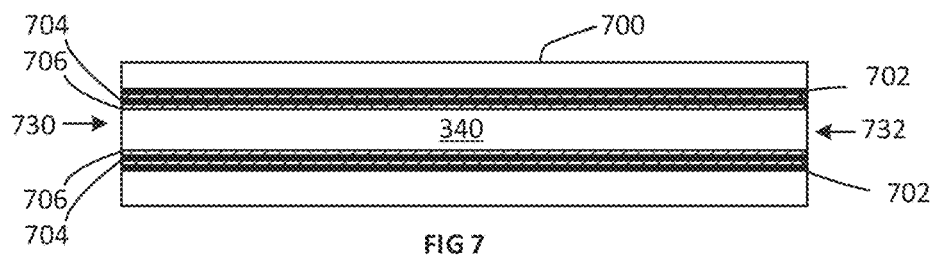
FIG. 7 illustrates a plan view depicting an example lateral waveguide of a broad area laser diode including a higher order mode suppression layer disposed adjacent the lateral waveguide along the longitudinal direction.

FIG. 7 illustrates a plan view depicting an example lateral waveguide of a broad area laser diode including a higher order mode suppression layer disposed adjacent the lateral waveguide along the longitudinal direction. In an example, broad area laser diode 700 comprises HOMSL 702 disposed symmetrically about lateral waveguide 340. HOMSL 702 is an aperiodic higher-order mode suppression layer structure comprising an area of low index material 706 alternating with an area of high index material 704. The low index material 706 has a lower index of refraction than the effective index of refraction of materials making up lateral waveguide 340. HOMSL 702 extends the entire length of lateral waveguide 340 from the rear facet 730 to the front facet 732.

Figure 8:
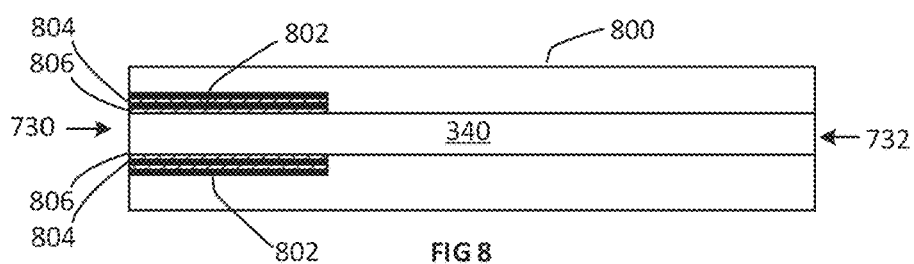
FIG. 8 illustrates a plan view depicting an example lateral waveguide of a broad area laser diode including a partial-length higher order mode suppression layer disposed adjacent the lateral waveguide along the longitudinal direction.

FIG. 8 illustrates a plan view depicting an example lateral waveguide of a broad area laser diode including a higher order mode suppression layer disposed adjacent the lateral waveguide along the longitudinal direction. In an example, broad area laser 800 comprises a shortened HOMSL 802 disposed symmetrically about lateral waveguide 340. HOMSL 802 comprises an aperiodic higher-order mode suppression layer having low index materials 806 alternating with high index materials 804 similar to that depicted in FIG. 5. However, HOMSL 802 does not extend the full length of lateral waveguide 340 from rear facet 730 to front facet 732. Rather, HOMSL 802 extends only a portion of the length of lateral waveguide 340 extending specifically from the rear facet 730. The rear facet 730 is coated with a highly reflective (HR) coating and the front facet 732 is coated with a partially reflective (PR) coating. Extending HOMSL 802 only a short length from the rear facet 730 has the advantage of minimizing loss for the unsuppressed modes so that laser diode operates more efficiently without significantly increasing the loss for lower order modes/fundamental mode because the total intensity of the forward and backward propagating fields along the longitudinal direction is smaller towards the back facet compared to the front facet. Hence, the losses are proportionately smaller.

Figure 9:
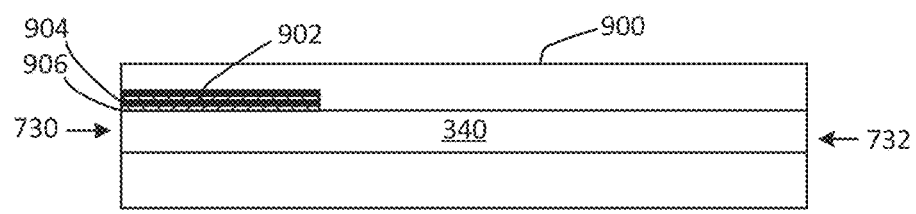
FIG. 9 illustrates a plan view depicting an example lateral waveguide of a broad area laser diode including a partial-length higher order mode suppression layer disposed adjacent the lateral waveguide along the longitudinal direction on only of the sides.

FIG. 9 illustrates a cross-sectional plan view depicting an example waveguide of a broad area laser diode including a higher order mode suppression layer disposed adjacent to the waveguide. In an example, broad area laser 900 comprises a shortened HOMSL 902 disposed asymmetrically about lateral waveguide 340 along the longitudinal direction. HOMSL 902 comprises an aperiodic higher-order mode suppression layer structure having low index materials 906 alternating with high index materials 904, similar to that depicted in FIG. 8. A single HOMSL 902 feature extends only a portion of the length of lateral waveguide 340 extending from the rear facet 730. Rear facet 730 is coated with an HR coating and front facet 732 is coated with a PR coating. Again, extending HOMSL 902 only a short length from the rear facet 730 has the advantage of minimizing loss for the unsuppressed modes so that the laser diode operates more efficiently without significantly increasing the loss for lower order modes/fundamental mode.

Figure 10:
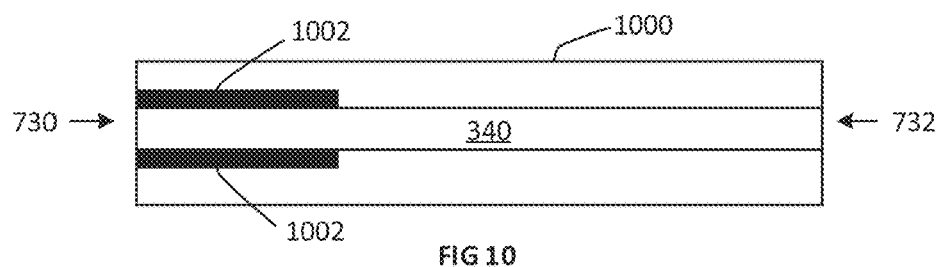
FIG. 10 illustrates a plan view depicting an example lateral waveguide of a broad area laser diode including a partial-length higher order mode suppression layer disposed adjacent the lateral waveguide along the longitudinal direction.

FIG. 10 illustrates a cross-sectional plan view depicting an example waveguide of a broad area laser diode including a higher order mode suppression layer disposed adjacent to the waveguide. In an example, broad area laser 1000 comprises a shortened HOMSL 1002 disposed symmetrically about lateral waveguide 340. HOMSL 1002 comprises a high-index material configured to have an index of refraction greater than the index of refraction of lateral waveguide 340. High-index material of HOMSL 1002 is capable of suppressing by anti-guiding higher order modes that spatially overlap with the high index material of HOMSL 1002 generated in lateral waveguide 340 while having little to no effect on lower order modes/fundamental mode generated therein because there is very little overlap between lower order modes/fundamental mode and the high index material.

Figure 11:
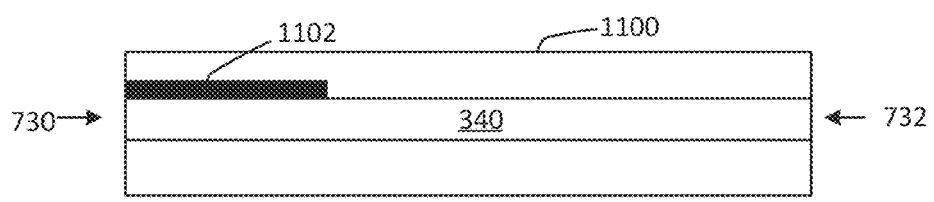
FIG. 11 illustrates a plan view depicting an example lateral waveguide of a broad area laser diode including a partial-length higher order mode suppression layer disposed adjacent the lateral waveguide along the longitudinal direction on only one side.

FIG. 11 illustrates a cross-sectional plan view depicting an example waveguide of a broad area laser diode including a higher order mode suppression layer disposed adjacent to the waveguide. In an example, broad area laser 1100 comprises a shortened HOMSL 1102 disposed asymmetrically about lateral waveguide 340. HOMSL 1102 comprises a high-index material similar to that illustrated in FIG. 10. HOMSL 1102 provides anti-guiding to higher-order modes generated in lateral waveguide 340. It is not necessary for HOMSL 1102 to be distributed symmetrically about lateral waveguide 340 in order to anti-guide at least some of the higher-order modes. Furthermore, the single HOMSL 1102 feature extends only a portion of the length of lateral waveguide 340 extending from the rear facet 730. Rear facet 730 is coated with an HR coating and front facet 732 is coated with a PR coating. Again, extending HOMSL 1102 only a short length from the rear facet 1130 has advantage of suppressing higher-order modes while minimizing loss for the unsuppressed modes so that the laser diode operates more efficiently without significantly increasing the loss for lower order modes and/or fundamental mode.

Figure 12:
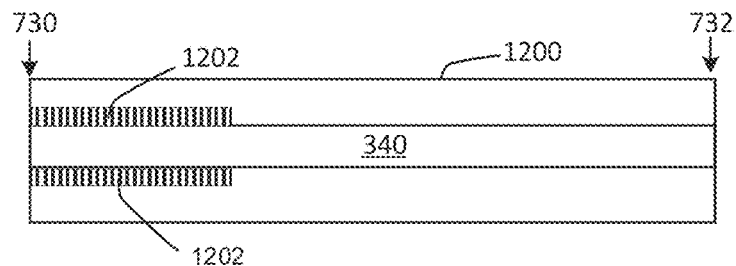
FIG. 12 illustrates a plan view depicting an example lateral waveguide of a broad area laser diode including a partial-length higher order mode suppression layer disposed adjacent the lateral waveguide along the longitudinal direction.

FIG. 12 illustrates a cross-sectional plan view depicting an example waveguide of a broad area laser including a higher order mode suppression layer disposed adjacent to a waveguide. In an example, broad area laser 1200 comprises a shortened HOMSL 1202 disposed symmetrically about lateral waveguide 340. HOMSL 1202 comprises an absorbing material that can either be semiconductor material in a variety of compositions, doping, crystallinity and/or morphology; semi-metals; or metals. The absorbing material functions to suppress higher-order modes in the lateral direction in lateral waveguide 340 by disproportionately increasing the round-trip loss of the higher order modes. HOMSL 1202 does not extend the full length of lateral waveguide 340 from rear facet 730. HOMSL 1202 extends only a portion of the length of lateral waveguide 340 extending specifically from rear facet 730. Extending HOMSL 1202 only a short length from the rear facet 730 has the advantage of minimizing loss for the unsuppressed modes so laser diode operates more efficiently without significantly increasing loss for lower order modes/fundamental mode.

Figure 13:
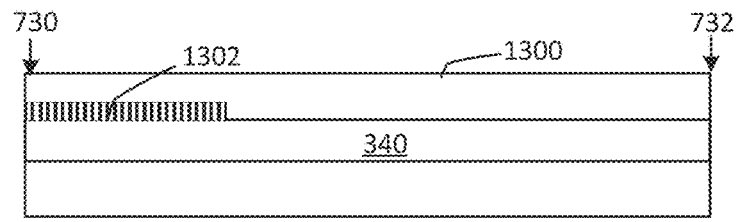
FIG. 13 illustrates a plan view depicting an example lateral waveguide of a broad area laser diode including a partial-length higher order mode suppression layer disposed adjacent the flared laser oscillator waveguide along the longitudinal direction on only one side.

FIG. 13 illustrates a cross-sectional plan view depicting an example flared laser oscillator waveguide including a higher order mode suppression layer disposed adjacent to the waveguide. An example, broad area laser 1300 comprises a shortened HOMSL 1302 disposed asymmetrically about lateral waveguide 340. HOMSL 1302 comprises an absorbing material similar to that illustrated in FIG. 12. HOMSL 1302 absorbs disproportionately higher-order modes in the lateral waveguide 340 thereby suppressing higher-order modes that overlap more spatially with HOMSL 1302. Therefore HOMSL 1302 suppresses higher-order modes minimizing impact on lower order modes and fundamental mode. Additionally, the single HOMSL 1302 feature extends only a portion of the length of lateral waveguide 340 extending from the rear facet 730. Rear facet 1330 is coated with HR coating and front facet 732 is coated with a PR coating. Extending HOMSL 1302 only a short length from the rear facet 730 has the advantage of suppressing higher-order modes while minimizing loss for the unsuppressed modes so the laser diode operates more efficiently without significantly increasing loss for lower order modes/fundamental mode.

Figure 14:
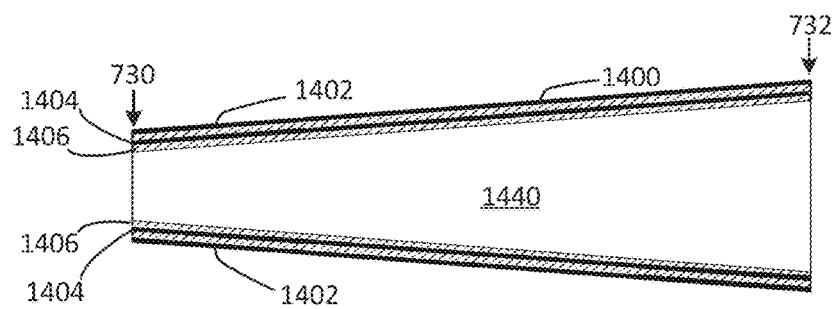
FIG. 14 illustrates a plan view depicting an example flared laser oscillator waveguide (i.e., lateral waveguide) laser diode including a higher order mode suppression layer disposed adjacent the flared laser oscillator waveguide along the longitudinal direction.

FIG. 14 illustrates a plan view depicting an example flared laser oscillator waveguide including a higher order mode suppression layer disposed adjacent to the waveguide. An example, laser 1400 includes flared laser oscillator waveguide (FLOW) 1418 may be used in place of a rectangular broad area laser waveguide. FLOW 1440 comprises a flared current injection region extending and widening between back facet 730 comprising high reflector (HR) coating and front facet 732 comprising a partial reflector (PR) coating along the longitudinal direction. By narrowing the width of the electrically-pumped stripe towards the high reflector facet, the higher order modes with higher divergence angles are prevented from coupling back into the laser. As a result, the slow-axis divergence of the laser is smaller compared to a device with rectangular geometry having the same width for the partial reflector. Furthermore, light propagating in the flared current injection region closer to PR front facet 732 can form a thermal waveguide that is closer to the width of the narrower, HR back facet 730 side causing a beam output at front facet 732 to have a substantially narrower beam width than the front facet 732 width. As a result, the-beam-parameter-product, BPP (slow-axis near-field width times the slow-axis divergence) is smaller for FLOW devices compared to BAL devices. Since the near-field is smaller than the physical width at the front facet 732 side, FLOW devices can be designed to have a larger total area compared to BAL without sacrificing BPP. The enlarged total pumped area provided by the flaring of the flared current injection region serves to reduce thermal resistance and electrical series resistance in the device, resulting in higher electrical-to-optical power conversion efficiency. This leads to higher output power at a given operating current compared to BAL devices. Higher power and smaller BPP leads to increased beam brightness in the slow-axis. In addition to the application to broad area diode lasers, the FLOW concept can also be applied to other types of semiconductor-based Fabry-Perot lasers, such as quantum cascade laser (QCL), interband quantum cascade lasers (IQL), by way of example. Broad area diode lasers with flared laser oscillator waveguides can also find particular use in laser diode modules, which can be configured for various applications such as fiber-coupling or direct pumping.

In an example, HOMSL 1402 may comprise an aperiodic structure of a first layer of low index material 1406 wherein the index of low index material 1406 is less than the effective refractive index of the material making up FLOW 1440. HOMSL 1402 also includes a second layer of high index material 1404 wherein the index of the high index material 1404 is greater than or lower than the effective refractive index of the material making up FLOW 1440. Therefore, as described above with reference to FIG. 5, HOMSL 1402 may be in the index guiding or anti-guiding regime. Referring still to FIG. 14, HOMSL 1402 coupled with FLOW 1440 compound any higher order mode suppression effects that might be achieved with either HOMSL 1402 or FLOW 1440 alone to further reduce BPP.

Figure 15:
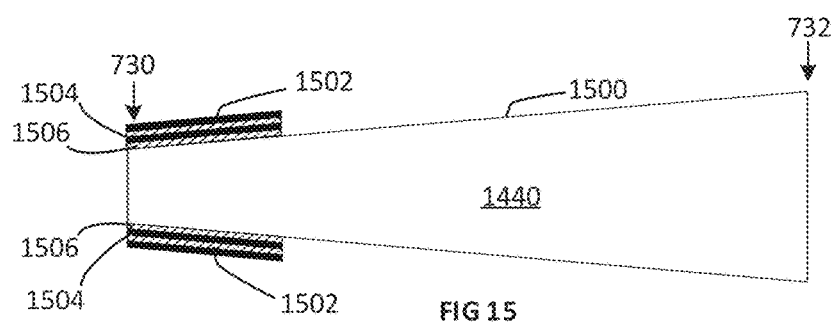
FIG. 15 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 15 illustrates a cross-sectional plan view depicting an example flared laser oscillator waveguide including a higher order mode suppression layer disposed adjacent to the waveguide. In an example, laser diode 1500 includes FLOW 1440 and shortened HOMSL 1502 disposed symmetrically about FLOW 1440. HOMSL 1502 comprises aperiodic structure including low index material 1506 and high index material 1504 assembled as described in FIG. 14. In an example, HOMSL 1502 extends only a portion of the length of FLOW 1440 from rear facet 730. HOMSL 1502 is not disposed near front facet 732. This architecture compounds the higher-order mode suppression achieved by a HOMSL structure in combination with a FLOW structure because extending HOMSL 1502 less than the full-length of FLOW 1440 minimizing loss for the unsuppressed modes so that laser diode operates more efficiently without significantly increasing the loss for lower order modes/fundamental mode, as explained above with respect to FIG. 8.

Figure 16:
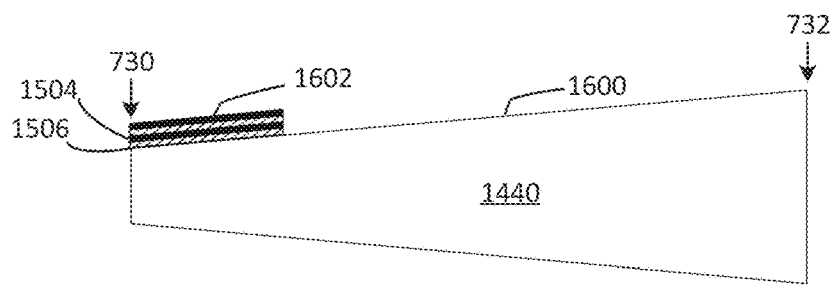
FIG. 16 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 16 illustrates a cross-sectional plan view depicting an example of a flared laser oscillator waveguide including a higher order mode suppression layer disposed adjacent to the waveguide. In an example, laser diode 1600 may comprise a HOMSL 1602 distributed asymmetrically about a FLOW 1440. HOMSL 1602 may extend only a partial length of FLOW 1440 from rear facet 730. In an example, a single shortened HOMSL 1602 combined with FLOW 1440 may operate to efficiently suppress higher-order modes. Such architecture may be desirable to, for example, save materials costs or accommodate other structures in the epitaxial layer structure of laser diode 1600.

Figure 17:
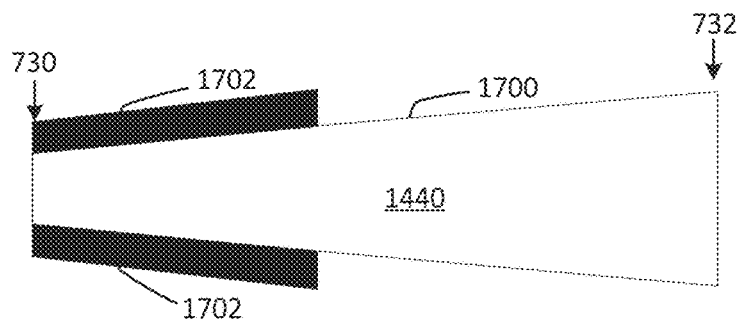
FIG. 17 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 17 illustrates a plan view depicting an example waveguide of a laser diode including a higher order mode suppression layer disposed adjacent to the wave guide. In an example, laser diode 1700 includes FLOW 1440 and HOMSL 1702 disposed symmetrically about FLOW 1440. HOMSL 1702 is shortened, extending from rear facet 730 only a portion of the length of FLOW 1440. HOMSL 1702 comprises high-index material compared to the material used in FLOW 1440. By narrowing the width of the electrically-pumped stripe of FLOW 1440 towards the high reflector facet, the higher order modes with higher divergence angles are prevented from coupling back into the laser. The shortened HOMSL 1702 provides further suppression of higher order modes by disproportionately anti guiding higher order modes that overlap with the high index material towards the HR facet.

Figure 18:
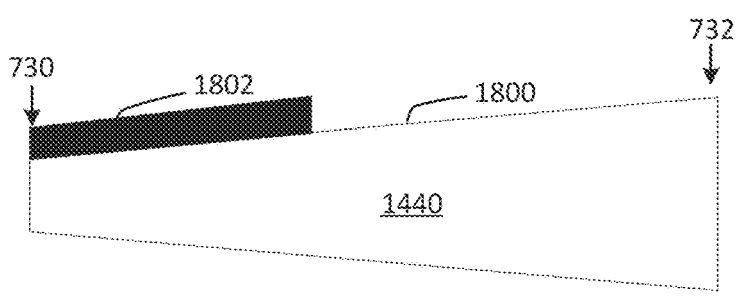
FIG. 18 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 18 illustrates a plan view depicting an example waveguide of a laser including a higher order mode suppression layer disposed adjacent to a waveguide. In an example, laser 1800 may comprise shortened HOMSL 1802 distributed asymmetrically about FLOW 1440. HOMSL 1802 may comprise a high-index material similar to that described in FIG. 17. HOMSL 1802 may extend only a partial length from rear facet 730 of FLOW 1440 from rear facet 730. The single shortened HOMSL 1802 combined with FLOW 1440 may operate to efficiently suppress higher-order modes. This architecture may be desirable to, for example, save materials costs or accommodate other structures in the epitaxial layer structure of laser 1800.

Figure 19:
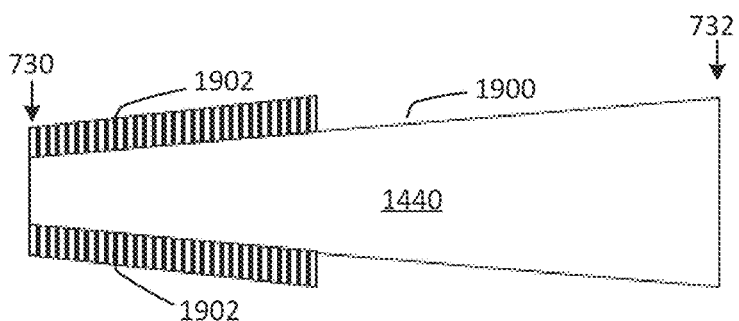
FIG. 19 illustrates a plan view depicting an example flared laser oscillator waveguide (i.e., lateral waveguide) laser diode including a partial length higher order mode suppression layer disposed adjacent the flared laser oscillator waveguide along the longitudinal direction.

FIG. 19 illustrates a plan view depicting an example flared laser oscillator waveguide including a higher order mode suppression layer disposed adjacent to the waveguide. In an example, laser diode 1900 includes FLOW 1440. HOMSL 1902 is disposed symmetrically about FLOW 1440. HOMSL 1902 is shortened, extending from rear facet 730 only a portion of the length of FLOW 1440. HOMSL 1902 comprises absorbing material. As discussed with reference to FIG. 4, the absorbing material introduces higher loss preferentially to the higher order modes and thereby suppresses higher-order modes that spatially overlap with HOMSL 1902.

Figure 20:
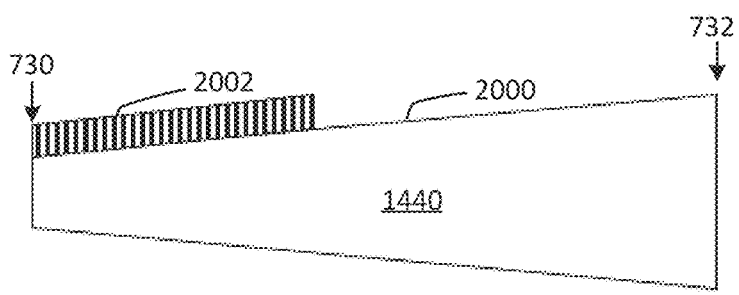
FIG. 20 illustrates a plan view depicting an example flared laser oscillator waveguide (i.e., lateral waveguide) laser diode including a partial length higher order mode suppression layer disposed adjacent the flared laser oscillator waveguide along the longitudinal direction on only one side.

FIG. 20 illustrates a cross-sectional plan view depicting an example flared laser oscillator waveguide including a higher order mode suppression layer disposed adjacent to the waveguide. In an example, laser 2000 may comprise shortened HOMSL 2002 distributed asymmetrically about FLOW 1440. HOMSL 2002 may comprise an absorbing material similar to that described with respect to FIG. 19. HOMSL 2002 may extend only a partial length from rear facet 730 of FLOW 1440. A single shortened HOMSL 2002 combined with FLOW 1440 may operate to more efficiently suppress higher-order modes than either HOMSL 2002 or FLOW 1440 alone. This architecture may be desirable to, for example, save materials costs or accommodate other structures in the epitaxial layer structure of laser 2000.

Gain Tailoring Approach

Figure 27:
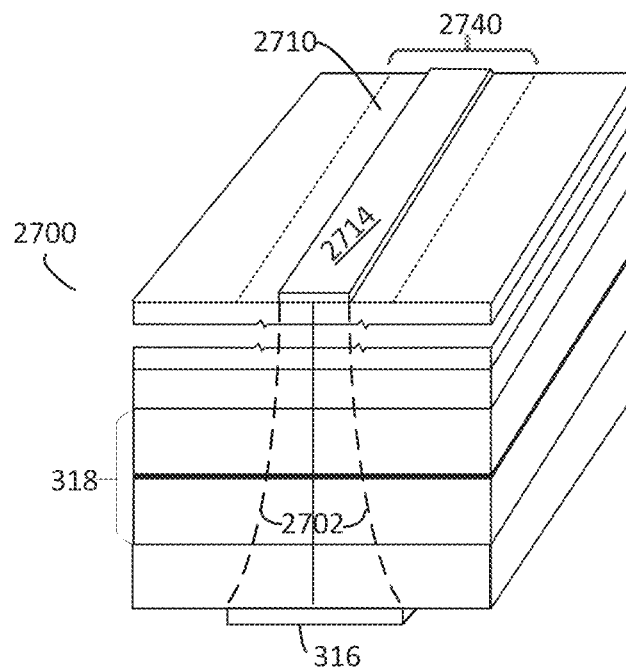
FIG. 27 illustrates a cross-sectional perspective view depicting a vertical epitaxial layer structure of an example laser diode including a tailored n-side current injection scheme.

In an example, higher order modes may be reduced in the lateral waveguide by reducing the amount of current that reaches the active layer in the lateral waveguide in which higher order modes proliferate. This can be accomplished through gain tailoring. Conventionally, gain tailoring involves current injection from the p-side of the heterostructure. However, gain tailoring from the p-side is fraught with inefficiencies. Gain tailoring from the n-side, on the other hand, generates diffused carrier distribution that overlaps more closely to primarily the fundamental mode and then to the lower order mode profiles, providing higher gain to the desired modes and lower gain to the undesirable higher order modes FIG. 27 illustrates a cross-sectional perspective view depicting a vertical epitaxial layer structure of an example laser diode including a tailored n-side current injection scheme. In an example, gain tailoring is performed by current injection via n-metal contact 2714 that is patterned to be narrower than p-metal contact 316. N-metal contact 2714 is disposed in the center of lateral waveguide 2740 in the longitudinal direction and cavity 2710 enabling lateral carrier distribution pattern 2702.

Figure 28:
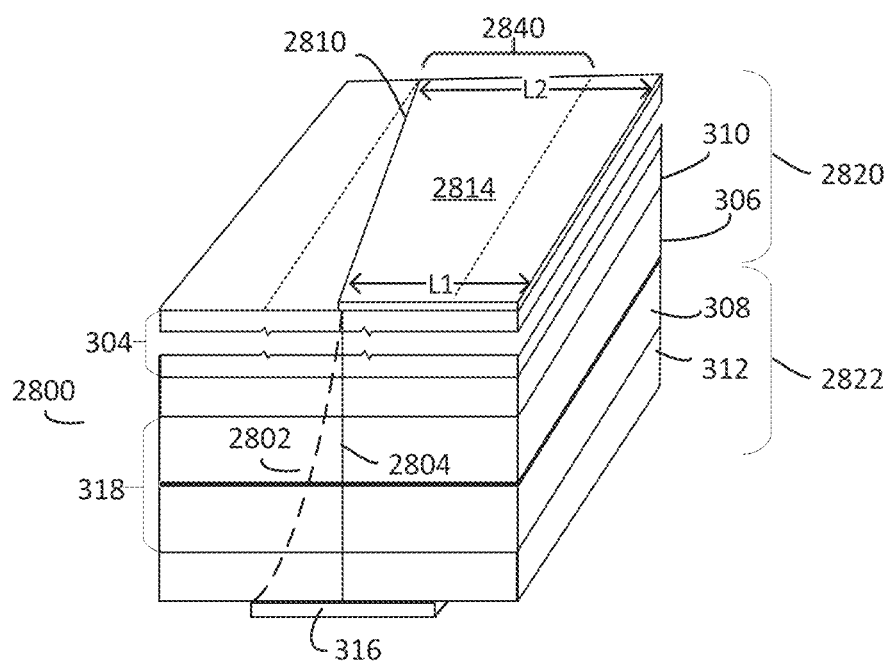
FIG. 28 illustrates a cross-sectional perspective view depicting a vertical epitaxial layer structure of an example laser diode including a tailored n-side current injection scheme.

FIG. 28 illustrates a cross-sectional perspective view depicting a vertical epitaxial layer structure of an example laser diode including a tailored n-side current injection scheme. Laser diode 2800 comprises an n-side 2820 and a p-side 2822. N-side 2820 includes n-metal contact 2814, n-cladding layer 310, n-type semiconductor layer 306 and n-substrate 304. P-side 2822 includes p-cladding layer 312, p-type semiconductor layer 308, and p-metal contact 316. Transverse waveguide 318 comprises quantum well 302, n-type semiconductor layer 306 and p-type semiconductor layer 308. Longitudinal waveguide 2840 can be defined in a variety of ways (e.g., by gain guiding, ridge waveguide, or index guiding or the like or a combination thereof), illustrated by dotted lines shown on top of substrate 304 and n-metal contact 2814. P-metal contact 316 is positioned under p-cladding layer 312. N-metal contact 2814 extends along cavity 2810 of longitudinal waveguide 2840.

Gain tailoring from the n-side may be achieved by introduction of a lateral carrier distribution pattern 2802 by disposing a narrow strip of n-metal contact 2814 on the n-side 2820 of laser diode 2800 rather than the conventional metallizing of the full n-side. Thin n-metal contact 2814 may be disposed at a variety of locations opposite p-metal contact 316. In one example, n-metal contact 2814 is offset such that its edge is located at the emitter half-plane 2804. Gain tailoring is performed from the n-metal side 2820 that reduces higher-order modes propagating in waveguide 2840 by reducing the amount of gain to the higher-order modes.

In an example, n-metal contact 2814 can have a variable width along the cavity in order to modulate the carrier profile in the lateral and longitudinal directions. This is shown in FIG. 28 wherein a first width L1 of n-metal contact 2814 is less than a second width L2. This provides gain tailoring in the longitudinal direction which reduces gain to the higher order modes towards HR (high reflective) facet so that laser diode 2800 operates more efficiently without significantly increasing the loss for lower order modes/fundamental mode.

Figure 29:
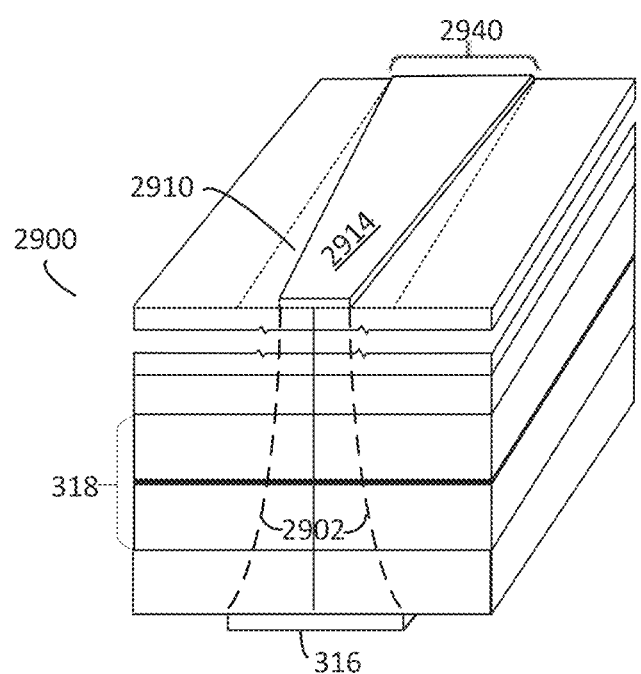
FIG. 29 illustrates a cross-sectional perspective view depicting a vertical epitaxial layer structure of an example laser diode including a tailored n-side current injection scheme.

FIG. 29 illustrates a cross-sectional perspective view depicting a vertical epitaxial layer structure of an example laser diode including a tailored n-side current injection scheme. In an example, gain tailoring is performed by current injection via flared n-metal contact 2914 that is patterned to be narrower than p-metal contact 316. N-metal contact 2914 is narrower on HR side and wider on PR side (but centered laterally). N-metal contact 2914 is disposed in the center of lateral waveguide 2940 in the longitudinal direction and cavity 2910 enabling lateral carrier distribution pattern 2902.

Hybrid Gain Tailoring/HOMSL Approach

Further reduction of higher-order modes in a lateral waveguide may be performed using a hybrid approach by 1) reducing proliferation of higher-order modes in the waveguide by using a tailored current injection scheme to tailor gain or discriminate gain to higher-order modes thereby starving them of gain and suppressing the higher-order modes and 2) including a HOMSL structure adjacent to the lateral waveguide along the longitudinal direction to further suppress higher-order modes generated despite the gain tailoring.

Figure 21A:
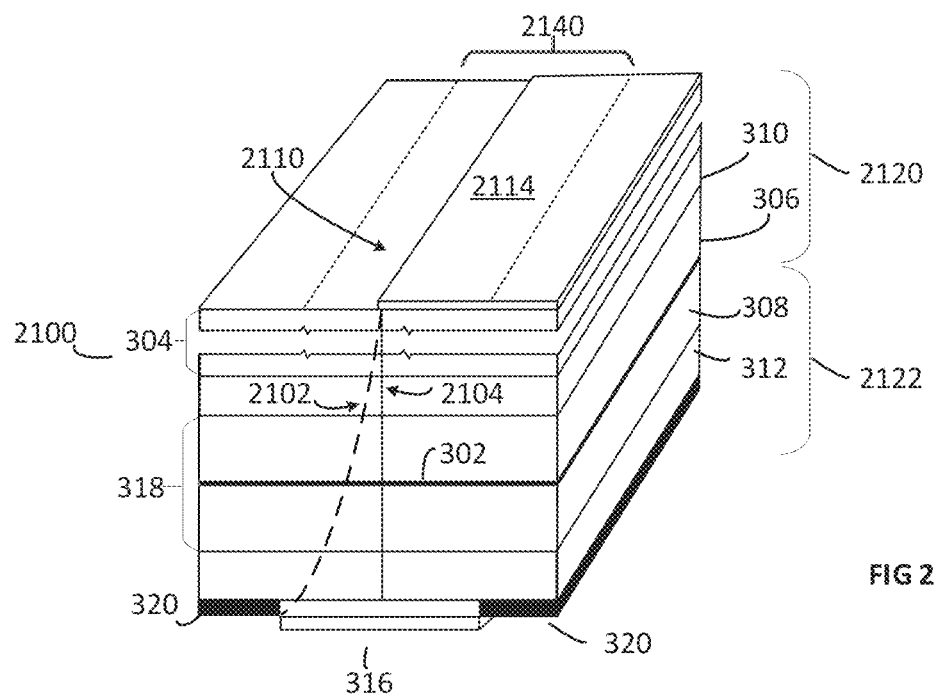
FIG. 21A illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

FIG. 21A illustrates a cross-sectional perspective view depicting a vertical epitaxial layer structure of an example laser diode including a tailored n-side current injection scheme and a higher order mode suppression layer disposed adjacent to the lateral waveguide. Laser diode 2100 comprises an n-side 2120 and a p-side 2122. N-side 2120 includes n-metal contact 2114, n-cladding layer 310, n-type semiconductor layer 306 and n-substrate 304. P-side 2122 includes p-cladding layer 312, p-type semiconductor layer 308, p-metal contact 316 and HOMSL 320. Waveguide 318 comprises quantum well 302, n-type semiconductor layer 306 and p-type semiconductor layer 308. Longitudinal waveguide 2140 is defined in a variety of ways (e.g., by gain guiding, ridge waveguide, or index guiding or the like or a combination thereof). Longitudinal waveguide 2140 includes cavity 2110 illustrated by dotted lines shown on top of substrate 304 and n-metal contact 2114. P-metal contact 316 is positioned under p-cladding layer 312. N-metal contact 2114 extends along cavity 2110 of longitudinal waveguide 2140.

As discussed above, gain tailoring from the n-side may be achieved by introduction of a lateral carrier distribution pattern 2102 by disposing n-metal contact 2114 on the n-side of laser diode. In FIG. 21A, n-metal contact 2114 is offset such that its edge is located at the emitter half-plane 2104. Carrier injection is performed from the n-metal side. Additionally, HOMSL 320 comprising a high-index material is disposed symmetrically along the longitudinal direction about lateral waveguide 2110. This hybrid approach can reduce higher-order modes propagating in waveguide 2140 by reducing the amount of gain to the higher-order modes and suppressing higher-order modes via HOMSL 320.

Figure 21B:
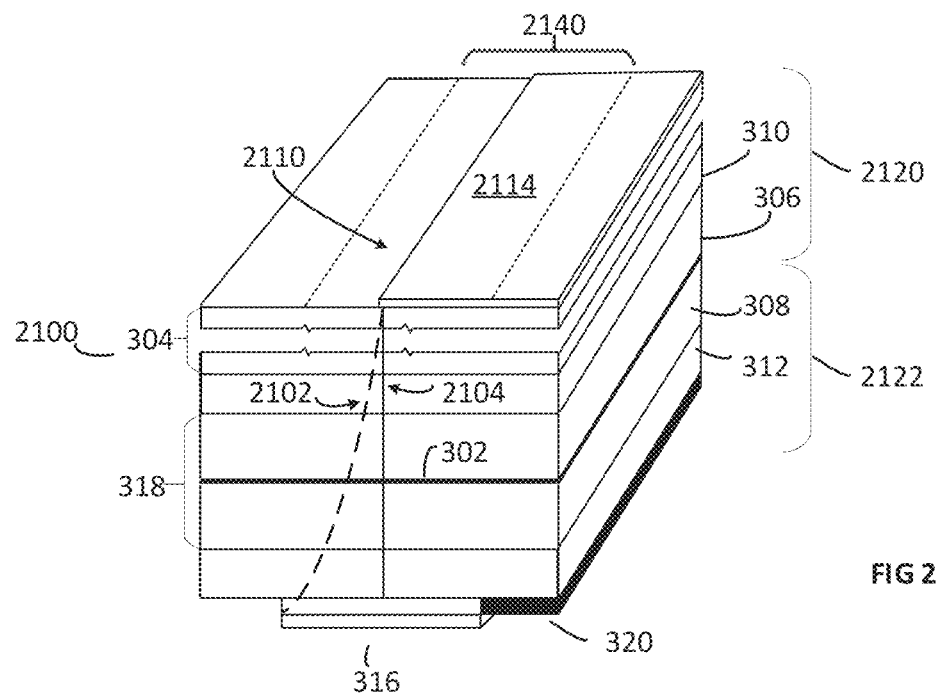
FIG. 21B illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

In another example, a HOMSL structure that is disposed asymmetrically about waveguide 2140 may be used rather than a symmetrically disposed HOMSL structure. In one example, asymmetric HOMSL structure, as illustrated in FIGS. 9, 11, 16, 18, and 20 should be disposed in-line in the heterostructure with the n-metal contact 2114 as shown in FIG. 21B. This configuration is more efficient than having the HOMSL structure on the opposite side because the higher-order mode is gain starved and will be below threshold carrier density.

Figure 22:
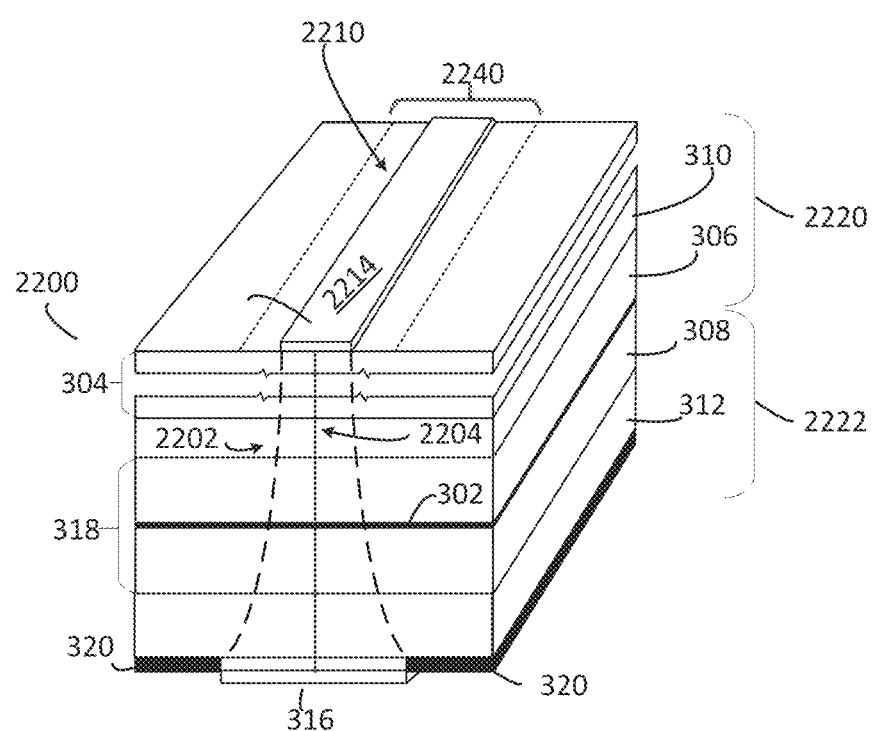
FIG. 22 illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

Furthermore, other HOMSL structures may be used to perform the hybrid gain tailoring/HOMSL higher order mode suppression method described herein. For example, rather than using the high index materials of HOMSL 320, absorbing and/or aperiodic materials as described above with respect to HOMSL 402 of FIG. 4 and HOMSL 502 of FIG. 5 may be used. Moreover, hybrid gain tailoring/HOMSL approach using p-side gain tailoring will provide improved higher order mode suppression over conventional p-side gain tailoring or higher order mode suppression using a HOMSL structure alone. FIG. 22 illustrates a cross-sectional perspective view depicting a vertical epitaxial layer structure of an example laser diode including a tailored n-side current injection scheme and a higher order mode suppression layer disposed adjacent to the waveguide. In an example, n-metal contact 2214 is patterned to be narrower than the width of p-metal contact 316. N-metal contact 2214 is centered at the half-plane 2204 of the waveguide 2240. Doing so generates diffused carrier distribution along the path indicated by 2202 in the lateral direction thus creating a carrier density profile that overlaps more closely primarily to the fundamental mode and then to the lower order mode profiles compared to the suppressed higher order modes. This current injection profile is configured to optimize overlap with the lateral lower order modes and fundamental modes by providing higher gain to the desired modes and lower gain to the undesirable higher order modes. Additionally, the width of n-metal contact 2214 can be variable along cavity 2210 to modulate the magnitude of the carriers injected along the longitudinal direction of cavity 2210.

Figure 23:
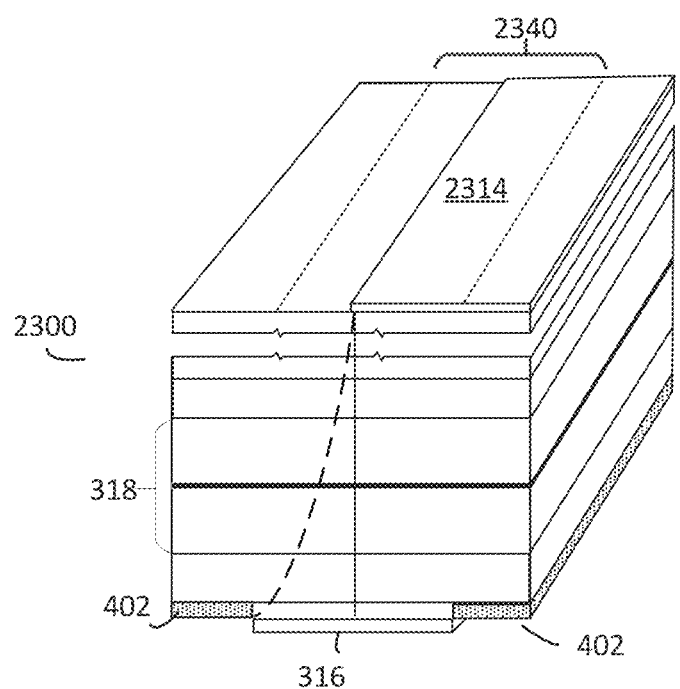
FIG. 23 illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

FIG. 23 illustrates a cross-sectional perspective view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2314 that is offset with respect to p-metal contact 316. HOMSL 402 (see FIG. 4) is positioned symmetrically about lateral waveguide 2340 along the longitudinal direction and comprises an absorbing material. In an example, HOMSL 402 can be n- or p-doped GaAs or ordered or disordered-InGaAs with lower bandgap than the laser wavelength.

Figure 24:
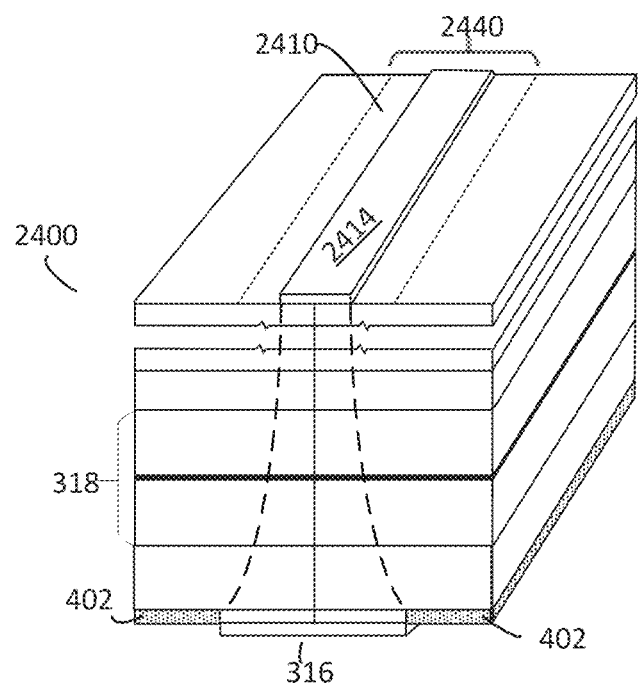
FIG. 24 illustrates a cross-sectional perspective view depicting a vertical epitaxial layer structure of an example laser diode including a tailored n-side current injection scheme and a higher order mode suppression layer disposed adjacent to the lateral waveguide along the longitudinal direction.

FIG. 24 illustrates a cross-sectional perspective view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2414 that is patterned to be narrower than p-metal contact 316. N-metal contact 2414 is disposed in the center of lateral waveguide 2440 and cavity 2410. HOMSL 402 (see FIG. 4) is positioned symmetrically about lateral waveguide 2440 and comprises an absorbing material.

Figure 25:
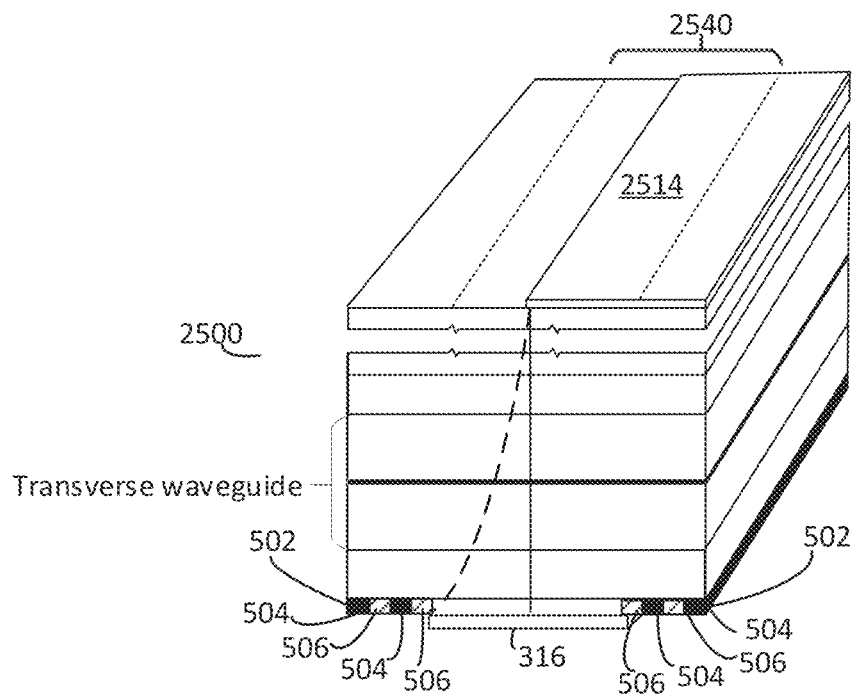
FIG. 25 illustrates a cross-sectional perspective view depicting a vertical epitaxial layer structure of an example laser diode including a higher order mode suppression layer disposed adjacent to the lateral waveguide along the longitudinal direction.

FIG. 25 illustrates a cross-sectional view depicting a vertical epitaxial layer structure of an example laser diode including a tailored n-side current injection scheme and a higher order mode suppression layer disposed adjacent to the waveguide. In an example, gain tailoring is performed via n-metal contact 2514 that is offset with respect to p-metal contact 316. HOMSL 502 (see FIG. 5) comprising aperiodic high index layer 504 and low index layer 506 is positioned symmetrically about lateral waveguide 2540.

Figure 26:
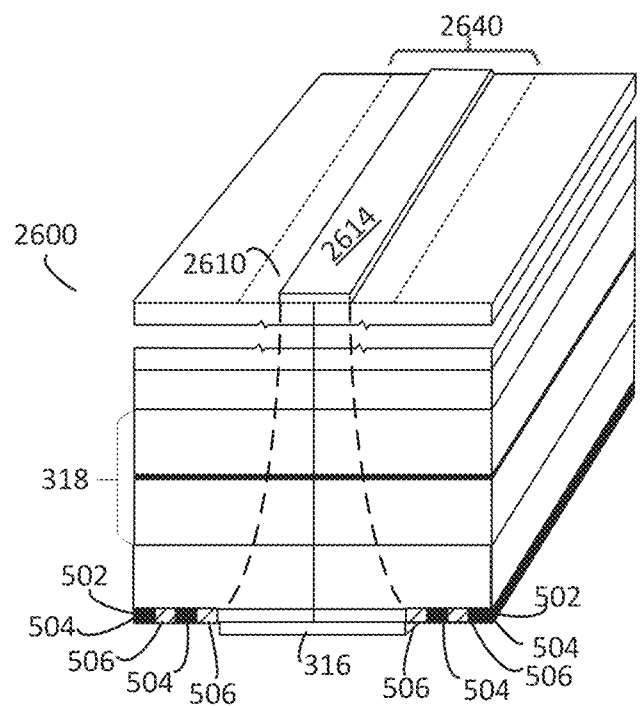
FIG. 26 illustrates a cross-sectional perspective view depicting a vertical epitaxial layer structure of an example laser diode including a higher order mode suppression layer disposed adjacent to the lateral waveguide along the longitudinal.

FIG. 26 illustrates a cross-sectional view depicting a vertical epitaxial layer structure of an example laser diode including a tailored n-side current injection scheme and a higher order mode suppression layer disposed adjacent to the waveguide. In an example, gain tailoring is performed by current injection via n-metal contact 2614 that is patterned to be narrower than p-metal contact 316. N-metal contact 2614 is disposed in the center of waveguide 2640 and cavity 2610. HOMSL 502 (see FIG. 5) is positioned symmetrically about longitudinal waveguide 2640 and comprises an absorbing material.

Buried HOMSL Features for Thermal Lensing Compensation

Index-guiding and gain-guiding are the predominant confinement mechanisms by which lateral optical modes (i.e., across the slow axis) are confined in broad area laser cavities. Vertical mode confinement (i.e., across the fast axis) is typically carried out with index-guiding using n-type and p-type cladding layers of predetermined refractive indexes. In general, lateral optical modes supported by a semiconductor laser cavity having a zero lateral refractive index variation in an unpowered, cold state become gain-guided during a powered state as the injected current induces a lateral index variation between electrically pumped and unpumped regions.

Under high power operation, a lateral thermal gradient induces a positive lateral index difference between the lateral waveguide and cladding associated with thermal lensing. The magnitude of a positive lateral index contrast induced by thermal lensing can depend on various characteristics and parameters of the cavity, including length, semiconductor layer thicknesses, carrier densities, active layer type and thickness, emitter/reflector widths, gain, operating wavelength, amount of waste heat generated by the diode laser, and heat transfer between the diode junction and the heatsink, etc., as will be readily appreciated by those with skill in the art.

The slow axis divergence angle of an output beam emitted by the semiconductor device may be strongly influenced by the lateral waveguide confinement near the high reflector facet. Index-guiding (brought on by thermal lensing) in the lateral waveguide near the high-reflector facet may support unwanted higher order lateral modes leading to slow axis divergence and reduced beam quality.

Examples herein describe methods, systems and apparatuses to suppress the onset of higher order lateral modes in device operation caused by thermal lensing induced high index contrast. The increased waveguide index contrast from the thermal lens is offset or compensated by forming an index compensation region on the HR side of the Fabry-Perot cavity. This reduces the magnitude of the thermal lens induced index contrast.

Figure 30A:
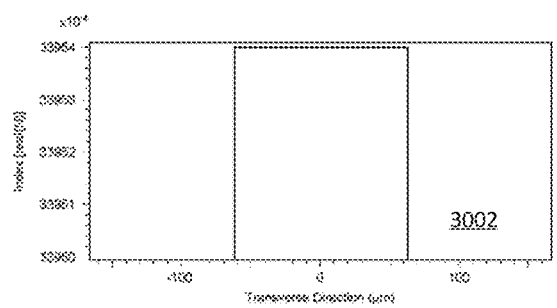
FIG. 30A is a graph illustrating a conventional step-index profile in the transverse direction of a single emitter laser diode, at low power operation without significant thermal lensing.
Figure 30B:
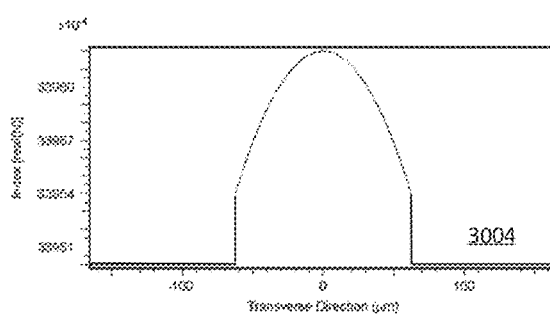
FIG. 30B is a graph illustrating a step-index profile with a parabolic profile added.
Figure 30C:
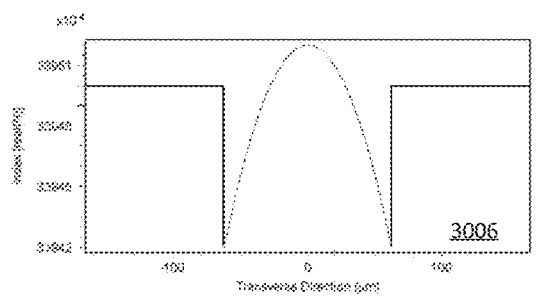
FIG. 30C is a graph illustrating an example "negative" step-index profile with a parabolic profile added, modeling the index profile in the region with negative compensation.

FIG. 30A is a graph 3002 illustrating a conventional step-index profile in the lateral direction of a single emitter laser diode at low power operation without significant thermal lensing. FIG. 30B is a graph 3004 illustrating a step-index profile in the lateral direction of a single emitter laser diode with a parabolic profile added. This is an index model for a conventional waveguide profile with thermal lensing at higher power operation. This Illustrates how the profile evolves under thermal lensing when at high operating current. FIG. 30C is a graph 3006 showing a potential index profile in the lateral direction of a single emitter laser diode compensating for thermal lensing at higher power operation. The "negative" step-index profile with a parabolic profile added, models the index profile in the region with negative compensation. The thermal lens index profile creates a weakly index-guided region at operating conditions.

As will be described in greater detail below, methods for achieving such a profile include introducing lateral features with higher refractive index adjacent to and/or overlapping the lateral waveguide, reducing the transverse waveguide thickness in the active stripe, and/or inserting a thin lower index layer within the transverse waveguide.

FIG. 31A-FIG. 31D depict various views of a laser diode 3100.

Figure 31A:
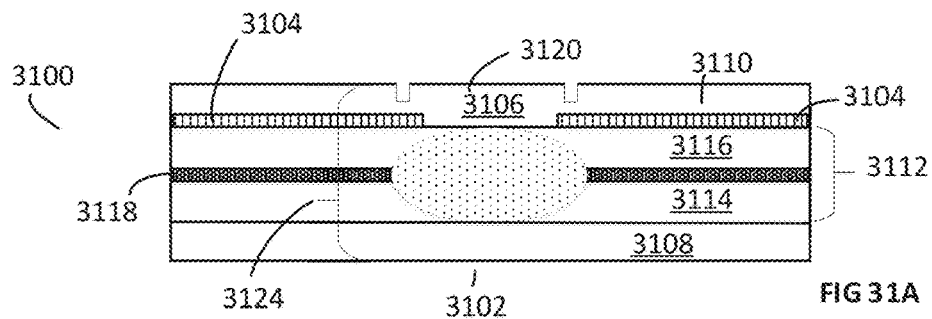
FIG. 31A is a cross-sectional view of a vertical epitaxial layer structure from the highly reflective (HR) side of an example laser diode including a buried higher order mode suppression layer disposed on adjacent sides of a lateral waveguide and extending in the longitudinal direction.

FIG. 31A is a cross-sectional view of a vertical epitaxial layer structure of an example laser diode 3100 including a buried higher order mode suppression layer (HOMSL) 3104 disposed on adjacent sides of a lateral waveguide 3106. Laser diode 3100 may comprise various geometries and configurations, and include various arrangements of p-type, n-type, active, cap, and dielectric layers. The term "buried" herein is intended to refer to a higher order mode suppression layer and/or feature that is disposed between layers within the laser diode 3100 (or other laser diodes describe herein) epitaxial layer structure. However, in some examples, the higher order mode suppression layer or feature may not be buried and may operate in the same or a similar way as the buried higher order mode suppression layer or feature.

In an example, laser diode 3100 is represented in a simplified epitaxial structure and includes an n-type cladding layer 3108 and a p-type cladding layer 3110 between which a transverse waveguide or cavity 3112 is formed. Transverse waveguide 3112 is orthogonal to lateral waveguide 3106 and includes an n-type waveguide layer 3114, a p-type waveguide layer 3116, and an active layer 3118. The active layer 3118 typically includes one or multiple quantum wells, but other configurations are possible, including p-n junction homostructures, heterostructures, double-heterostructures, quantum wires, quantum dots, etc. The p-type clad layer 3110 can be etched into various shapes to form ridge structures 3120 or mesas either of which may extend the entire longitudinal length of the diode 3100 or may extend only a partial length of the diode 3100 from the partial reflector (PR) side 3122. Additionally, one or more dielectric and/or cap layers (not shown) can be formed on the laser diode 3100 to guide current through the active layer 3118.

Figure 31B:
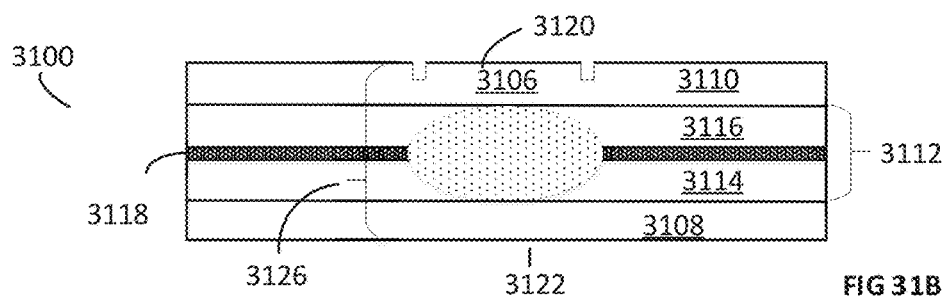
FIG. 31B is a cross-sectional view of a vertical epitaxial layer structure from the partially reflective (PR) side of the example laser diode depicted in FIG. 31A including a buried higher order mode suppression layer disposed on adjacent sides of a lateral waveguide.

FIG. 31B is a cross-sectional view of a vertical epitaxial layer structure from the partially reflective (PR) side 3122 of the example laser diode 3100 depicted in FIG. 30A.

Lateral waveguide 3106 is bounded in a longitudinal direction at a first end by the HR coated facet 3124 and at a second end by a PR coated facet 3126. In an example, HOMSL 3104 is formed beneath p-type cladding layer 3110 on one or both sides of the lateral waveguide. HOMSL 3104 extends longitudinally from HR coated facet 3124 a length less than the distance between the HR facet and the PR facet. The buried HOMSL 3104 does not extend to the PR side 3122 and therefore is not visible in the epitaxial layers as viewed from the PR side 3122.

Figure 31C:
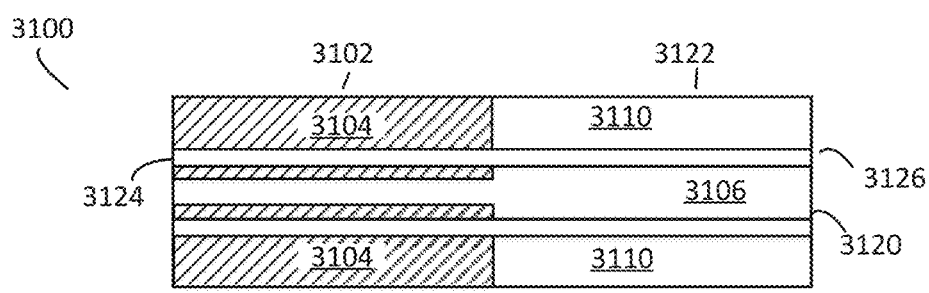
FIG. 31C is a plan view of an example laser diode including a buried higher order mode suppression layer disposed on adjacent sides of a lateral waveguide and extending in the longitudinal direction.

FIG. 31C is a plan top side view of an example laser diode 3100 including buried HOMSL 3104 features disposed on adjacent sides of a lateral waveguide 3106 and extending in the longitudinal direction from HR facet 3124.

During high-power operation of laser diode 3100, temperature profile resulting from lateral heat spreading leads to thermal lensing in lateral waveguide 3106 which induces a refractive index contrast in the lateral waveguide 3106. In an example, partial or full compensation for the increased refractive index contrast in the lateral waveguide 3106 may be achieved by strategically placing HOMSL 3104 features adjacent to lateral waveguide 3106 on one or both of the lateral sides. HOMSL 3104 is formed in between the p-type waveguide layer 3116 and the p-type cladding layer 3110. Alternatively, HOMSL 3104 may be formed in between the n-type waveguide layer 3114 and the n-type cladding layer 3108. HOMSL 3104 may further be formed to overlap with lateral waveguide 3106 slightly to compensate for mode size mismatch between the two regions or for other reasons.

The addition of HOMSL 3104 structures (e.g., comprising GaAs) to a BAL can be performed via a variety of methods known to those of skill in the art and claimed subject matter is not limited in this regard. For example, a modified mask and etching may be used to form a HOMSL 3104 at selected offsets from ridge waveguide 3120. The HOMSL 3104 high index features, placed on the edges of the ridged waveguide 3120, may disproportionately overlap higher order modes, but the mismatch in mode size of identical order modes between the HR side and PR side means the offset between the oxide ridge 3120 and HOMSL 3104 in the lateral direction may be selected to avoid incurring excessive losses by outcoupling of the supported lasing modes.

Various simulations indicate that for different order of magnitude in index contrasts, the mode size trend is predictable regardless of which order mode. The order of magnitude of index contrasts are in the range of $10^{-5} < \Delta n < 10^{-3}$. The predicted mismatch in lateral waveguide 3106 size (or the overlap in HOMSL 3104 over the lateral waveguide) may be in the range of 2-6 um on either side or 4-12 um total.

In another example, HOMSL 3104 is formed to laterally overlap the lateral waveguide 3106 to compensate a mismatch in lateral mode area between a HOMSL 3104 region and an index-guided region by between 0-10 um on either side, or 0-20 um total.

Figure 31D:
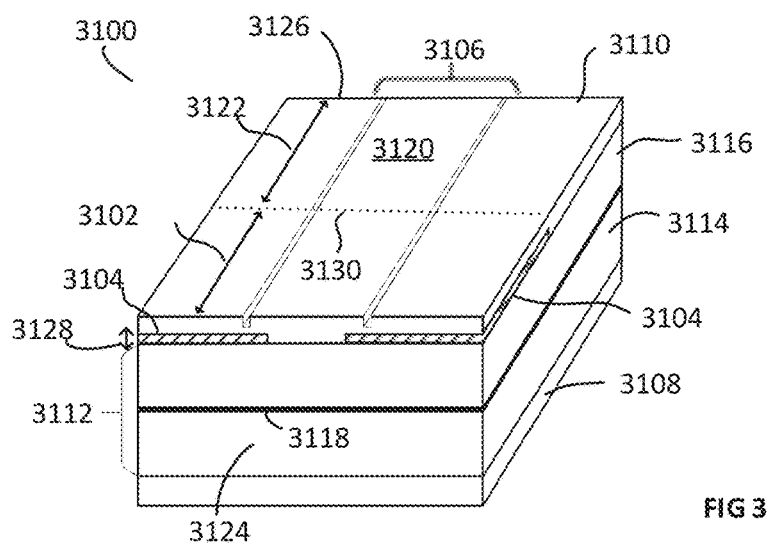
FIG. 31D is a cross-sectional perspective view of a vertical epitaxial layer structure from the highly reflective (HR) side of an example laser diode including a buried higher order mode suppression layer disposed on adjacent sides of a lateral waveguide and extending in the longitudinal direction.

FIG. 31D is a cross-sectional perspective view of a vertical epitaxial layer structure from the HR side 3102 of an example laser diode 3100 including buried HOMSL 3104 disposed on adjacent sides of a lateral waveguide 3106 and extending longitudinally from the HR coated facet 3124.

In an example, HR side 3102 extends from HR coated facet 3124 to about midpoint 3130 (dotted line). PR side 3122 extends from PR coated facet 3126 to about midpoint 3130.

Under operating conditions, HR side 3102 experiences thermal lensing, however, with suppression or compensation of HOMSL 3104 this region is weakly index guided; thus, it has an index profile corresponding approximately to that shown in FIG. 30C. Likewise, PR side 3122 comprises an index guided region that also experiences thermal lensing during operation without suppression or compensation of HOMSL 3104 and thus corresponds approximately to the index profile shown in FIG. 30B.

In order to reduce the magnitude of a thermal lens induced index contrast on the HR side 3102 of the laser diode 3100, HOMSL 3104 may comprise a higher index material than the surrounding materials. The relative index of refraction (n) for the HOMSL 3104 with respect to the transverse waveguide layers is $n_{HOMSL\ 3104} > n_{p\text{-}type\ cladding\ layer\ 3110}/n_{n\text{-}type\ cladding\ layer\ 3108} > n_{p\text{-}type\ waveguide\ layer\ 3116}/n_{n\text{-}type\ waveguide\ layer}$.

Additionally, to reduce the magnitude of the thermal lens induced index contrast on the HR side 3102, the refractive index and thickness 3128 of HOMSL 3104 are judiciously selected. The selection of the thickness 3128 should be based on its impact on the magnitude of the refractive index contrast (i.e., the potential effective index contrast on the HR side 3102 of the lateral waveguide 3106). A specific HOMSL 3104 thickness 3128, a threshold thickness or range of thicknesses (referred to collectively herein as "thickness") that will sufficiently reduce the magnitude of the thermal lens induced index contrast on the HR side 3102 may be identified by a variety of methods, including simulation, experimentation, reference table and predictive analysis, etc.

The thickness 3128 determines the Δn on the HR side 3102, relative to the thermal lens and reduces the guiding ability of the lateral waveguide 3106 in the region proximate HOMSL 3104. In various examples, thicknesses may be selected such that the thermal lens is mostly compensated to generate a weakly index guided region. This enables weak index guiding of a few lateral modes, or, in the extreme case, only a single lateral mode. at high operating current on the HR side 3102. Such a weakly guided region may support 10 or fewer lateral modes or may support only one mode. As a result, the lateral waveguide 3106 at the HR side supports fewer lateral modes and enables reduction of slow-axis divergence and higher brightness compared to conventional BALs.

Since the HOMSL is designed to mostly compensate thermal lens at high power operation, there may effectively be an anti-guided region on the HR side 3102 for low power operation, which transitions to weakly index guided for higher power operation with the onset of the thermal lens.

FIG. 32A-FIG. 32D depict various views of a laser diode 3200.

Figure 32A:
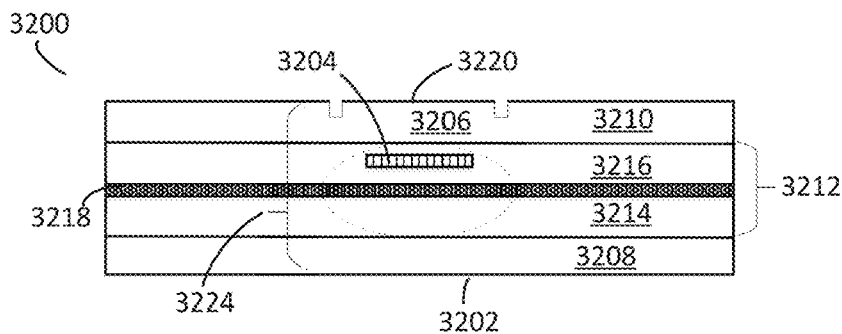
FIG. 32A is a cross-sectional view of a vertical epitaxial layer structure from the highly reflective (HR) side of an example laser diode including a buried higher order mode suppression layer disposed within a lateral waveguide and extending in the longitudinal direction.

FIG. 32A is a cross-sectional view of a vertical epitaxial layer structure of an example laser diode 3200 including a buried HOMSL 3204.

Laser diode 3200 is represented in a simplified epitaxial structure and includes an n-type cladding layer 3208 and a p-type cladding layer 3210 between which a transverse waveguide or cavity 3212 is formed. Transverse waveguide 3212 is orthogonal to lateral waveguide 3206 and includes an n-type waveguide layer 3214, a p-type waveguide layer 3216, and an active layer 3218. Ridge structures 3220 may extend a partial or the entire longitudinal length of the diode 3200 between HR side 3202 and PR side 3222.

HOMSL 3204 is disposed within transverse waveguide 3212 within the p-type waveguide layer 3216. Alternatively, HOMSL 3204 may be disposed in n-type waveguide layer 3214.

In an example, HOMSL 3204 may comprise a thin layer of lower index material. Although, HOMSL 3204 is disposed in the transverse waveguide 3212 it is also within the lateral waveguide 3206; thus, the effective index of the lateral waveguide 3206 is reduced by the presence of the lower index HOMSL 3204. The index of the lateral cladding 3210 is unchanged.

Figure 32B:
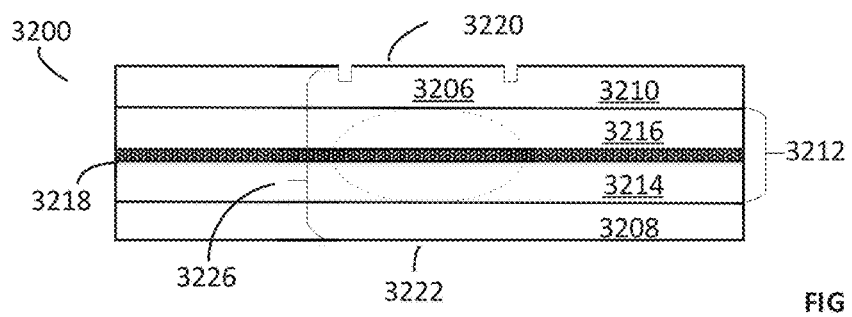
FIG. 32B is a cross-sectional view of a vertical epitaxial layer structure from the partially reflective (PR) side of the example laser diode depicted in FIG. 32A including a buried higher order mode suppression layer disposed within a lateral waveguide and extending in the longitudinal direction.

FIG. 32B is a cross-sectional view of a vertical epitaxial layer structure from the PR side 3222 of the example laser diode 3200 depicted in FIG. 32A including the HOMSL 3204 disposed within lateral waveguide 3206. Lateral waveguide 3206 is bounded in a longitudinal direction at a first end by the HR coated facet 3224 and at a second end by a PR coated facet 3226. In an example, HOMSL 3204 is buried in p-type waveguide layer 3216 (or n-type waveguide layer 3214). However, because HOMSL 3204 extends longitudinally from HR coated facet 3224 a length less than the distance between the HR facet and the PR facet it is not visible in the epitaxial layers as viewed from the PR side 3222.

Figure 32C:
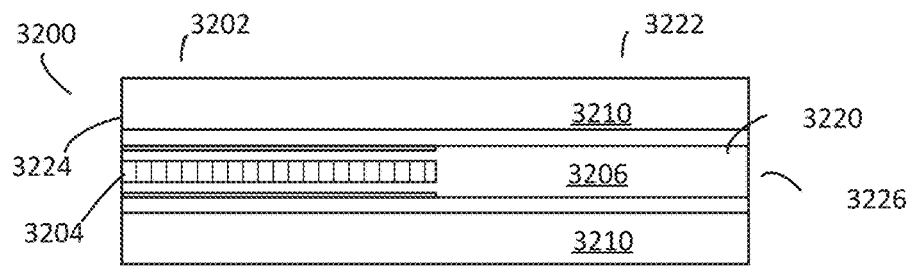
FIG. 32C is a plan view of an example laser diode including a buried higher order mode suppression layer disposed within a lateral waveguide and extending in the longitudinal direction.

FIG. 32C is a plan view of an example laser diode 3200 including a buried HOMSL 3204 disposed within a lateral waveguide and extending in the longitudinal direction.

During high-power operation of laser diode 3200, temperature profile resulting from lateral heat spreading leads to thermal lensing in lateral waveguide 3206 which induces a refractive index contrast in the lateral waveguide 3206. In an example, partial or full compensation for the increased refractive index contrast in the lateral waveguide 3206 may be achieved by strategically placing a lower index HOMSL 3204 within lateral waveguide 3206. HOMSL 3204 may be narrower laterally than the lateral waveguide 3206 by 0-10 um on either side or 0-20 um total.

The addition of HOMSL 3204 structures (e.g., comprising AlGaAs) to a BAL can be performed via a variety of methods known to those of skill in the art and claimed subject matter is not limited in this regard.

Figure 32D:
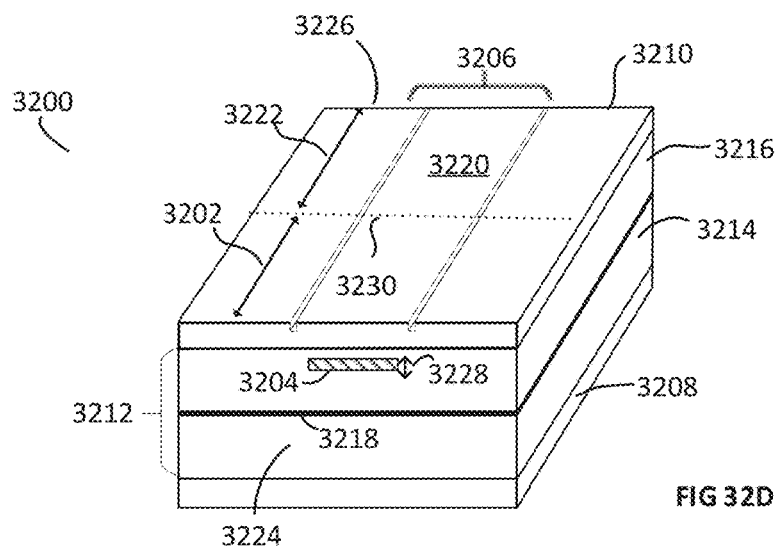
FIG. 32D is a cross-sectional perspective view of a vertical epitaxial layer structure from the highly reflective (HR) side of an example laser diode including a buried higher order mode suppression layer disposed within a lateral waveguide and extending in the longitudinal direction.

FIG. 32D is a cross-sectional perspective view of a vertical epitaxial layer structure from the HR side 3202 of an example laser diode 3200 including buried HOMSL 3204 disposed within the lateral waveguide 3206 and extending in the longitudinal direction from the HR coated facet 3224. In an example, HR side 3202 extends from HR coated facet 3224 to about midpoint 3230 (dotted line). PR side 3222 extends from PR coated facet 3226 to about midpoint 3230.

Under operating conditions, HR side 3202 experiences thermal lensing, however, with suppression or compensation of HOMSL 3204 by lowering the index contrast by introduction of a lower index material in the lateral waveguide 3206 the HR side 3202 region becomes weakly index guided. In order to reduce the magnitude of a thermal lens induced index contrast on the HR side 3202, HOMSL 3204 may comprise a lower index material than the surrounding materials. The relative index of refraction (n) for the HOMSL 3204 with respect to the transverse waveguide layers is: $n_{low\ Index\ layer} < n_{p\text{-}waveguide}/n_{n\text{-}waveguide} < n_{p\text{-}cladding}/n_{n\text{-}cladding}$ Similar to HOMSL 3104, to reduce the magnitude of the thermal lens induced index contrast on the HR side 3202, the thickness 3228 and refractive index of HOMSL 3204 is judiciously selected. The selection of the thickness 3228 is based on its impact on the magnitude of the refractive index contrast (i.e., the potential effective index contrast on the HR side 3202 of the lateral waveguide 3206). A specific HOMSL 3204 thickness 3228 that will sufficiently reduce the magnitude of the thermal lens induced index contrast on the HR side 3202 may be identified by a variety of methods, including simulation, experimentation, reference table and predictive analysis, etc.

The thickness 3228 determines the Δn on the HR side 3202, relative to the thermal lens and reduces the guiding ability of the lateral waveguide 3206 in the region proximate HOMSL 3204. In various examples, thicknesses may be selected such that the thermal lens is mostly compensated to generate a weakly index guided region. This enables weak index guiding of a few lateral modes, or, in the extreme case, only a single lateral mode, at high operating current on the HR side 3202. Such a weakly guided region may support 10 or fewer lateral modes or may support only one mode. As a result, the lateral waveguide 3206 at the HR side 3202 supports fewer lateral modes and enables reduction of slow-axis divergence and higher brightness compared to conventional BALs.

In various examples, HOMSL 3104 and HOMSL 3204 may be formed of any of a variety of materials known to those of skill in the art that satisfy disclosed constraints on dimension and the relative indexes of refraction sufficient to reduce the magnitude of thermal lensing induced index contrast in the lateral waveguide and claimed subject matter is not limited in this regard. For example, HOMSL 3104 and/or HOMSL 3204 may be formed of a variety of materials including gallium arsenide (GaAs), aluminum gallium arsenide (AlGaAs), indium gallium arsenide (InGaAs), indium aluminum gallium arsenide (InAlGaAs), and/or indium gallium phosphide (InGaAsP).

FIG. 33A-FIG. 33D depict various views of a laser diode 3300.

Figure 33A:
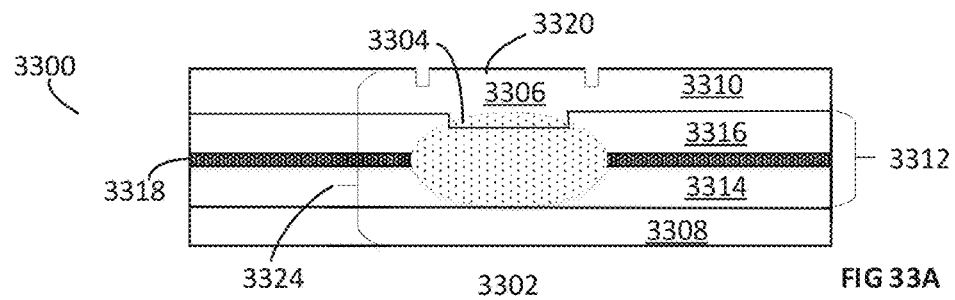
FIG. 33A is a cross-sectional view of a vertical epitaxial layer structure from the highly reflective (HR) side of an example laser diode including a higher order mode suppression layer comprising a reduced thickness waveguide portion disposed within a lateral waveguide and extending in the longitudinal direction.

FIG. 33A is a cross-sectional view of a vertical epitaxial layer structure of an example laser diode 3300 including a reduced thickness transverse waveguide portion referred to herein as HOMSL 3304. Laser diode 3300 is represented in a simplified epitaxial structure and includes an n-type cladding layer 3308 and a p-type cladding layer 3310 between which a transverse waveguide or cavity 3312 is formed. Transverse waveguide 3312 is orthogonal to lateral waveguide 3306 and includes an n-type waveguide layer 3314, a p-type waveguide layer 3316, and an active layer 3318. Ridge structure 3320 may extend a partial or the entire longitudinal length of the diode 3300 between HR side 3202 and PR side 3222. HOMSL 3304 may be formed within transverse waveguide 3312 in the p-type waveguide layer 3316. Alternatively, a reduced thickness transverse waveguide portion HOMSL 3304 may be formed in the n-type waveguide layer 3314. The HOMSL 3304 feature may be formed as a trench, divot, channel, or the like or a combination thereof.

Although, HOMSL 3304 is disposed in the transverse waveguide 3212 in the p-type waveguide layer 3316, it is also within the lateral waveguide 3306; thus, the effective index of the lateral waveguide 3306 is reduced by the presence of the HOMSL 3304.

Figure 33B:
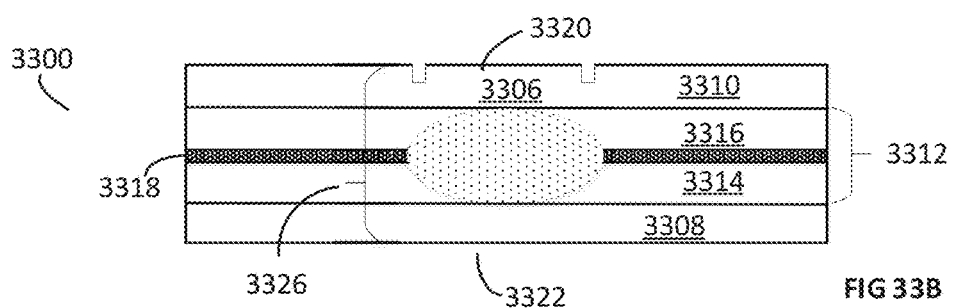
FIG. 33B is a cross-sectional view of a vertical epitaxial layer structure from the partially reflective (PR) side of the example laser diode depicted in FIG. 33A including a higher order mode suppression layer comprising a reduced thickness waveguide portion disposed within a lateral waveguide and extending in the longitudinal direction.

FIG. 33B is a cross-sectional view of a vertical epitaxial layer structure from the PR side 3322 of the example laser diode 3300 depicted in FIG. 33A including the HOMSL 3304 disposed within lateral waveguide 3306. Lateral waveguide 3306 is bounded in a longitudinal direction at a first end by the HR coated facet 3324 and at a second end by a PR coated facet 3326. In an example, HOMSL 3304 is formed in p-type waveguide layer 3316 (or n-type waveguide layer 3314). However, because HOMSL 3304 extends longitudinally from HR coated facet 3324 a length less than the distance between the HR facet 3324 and the PR facet 3326 it is not visible in the epitaxial layers as viewed from the PR side 3322.

Figure 33C:
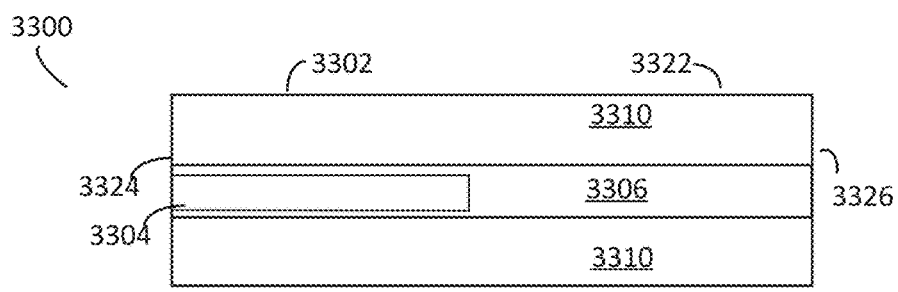
FIG. 33C is a plan view of an example laser diode including a higher order mode suppression layer comprising a reduced thickness waveguide portion disposed within a lateral waveguide and extending in the longitudinal direction.

FIG. 33C is a plan view of an example laser diode 3200 including HOMSL 3304 disposed within a lateral waveguide and extending in the longitudinal direction from HR coated facet 3324 a length less than the distance between the HR facet 3324 and the PR facet 3326.

During high-power operation of laser diode 3300, temperature profile resulting from lateral heat spreading leads to thermal lensing in lateral waveguide 3306 which induces a refractive index contrast in the lateral waveguide 3306. In an example, partial or full compensation for the increased refractive index contrast in the lateral waveguide 3306 may be achieved by strategically placing HOMSL 3304 within lateral waveguide 3306. A HOMSL 3304 trench may be formed to be narrower laterally than the lateral waveguide 3306 by, for example, 0-10 um on either side or 0-20 um total.

The addition of a HOMSL 3304 trench, divot, channel, etc. to a BAL can be performed via a variety of methods known to those of skill in the art and claimed subject matter is not limited in this regard. For example, HOMSL 3304 may be formed using etching down or selectively depositing thicker layers adjacent to the active stripe.

Figure 33D:
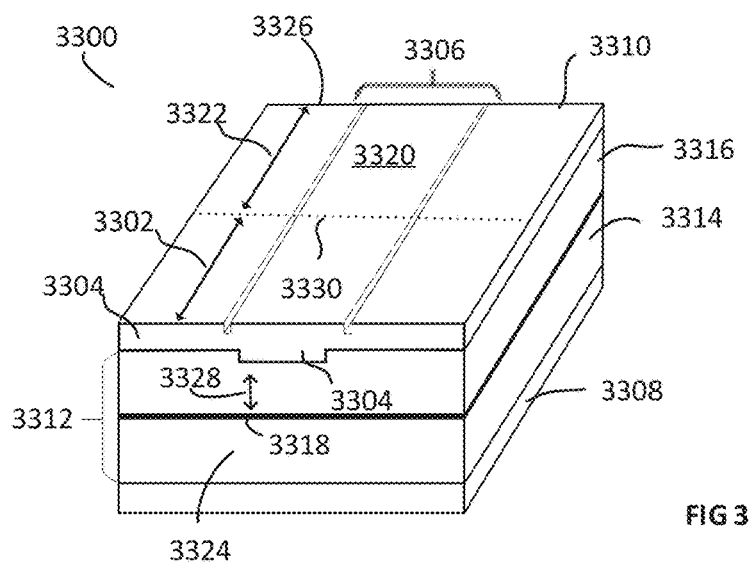
FIG. 33D is a cross-sectional perspective view of a vertical epitaxial layer structure from the highly reflective (HR) side of an example laser diode including a higher order mode suppression layer comprising a reduced thickness waveguide portion disposed within a lateral waveguide and extending in the longitudinal direction.

FIG. 33D is a cross-sectional perspective view of a vertical epitaxial layer structure from the HR side 3302 of an example laser diode 3300 including buried HOMSL 3304 disposed within the lateral waveguide 3306 and extending in the longitudinal direction from the HR coated facet 3324. In an example, HR side 3302 extends from HR coated facet 3324 to about midpoint 3330 (dotted line). PR side 3322 extends from PR coated facet 3326 to about midpoint 3330.

Under operating conditions, HR side 3302 experiences thermal lensing, however, with suppression or compensation of HOMSL 3304 by providing the portion of thinner transverse waveguide thickness the HR side 3302 region becomes weakly index guided. reducing the magnitude of a thermal lens induced index contrast on the HR side 3302. In an example, the thinner the transverse waveguide 3312 thickness the higher the effective index of refraction which may enable lateral waveguide 3306 to be lower index of refraction than the lateral cladding.

Similar to HOMSL 3104, to reduce the magnitude of the thermal lens induced index contrast on the HR side 3302, the thickness 3328 is judiciously selected. The selection of the thickness 3328 is based on its impact on the magnitude of the refractive index contrast (i.e., the potential effective index contrast on the HR side 3302 of the lateral waveguide 3306). A specific HOMSL 3304 thickness 3328 that will sufficiently reduce the magnitude of the thermal lens induced index contrast on the HR side 3302 may be identified by a variety of methods, including simulation, experimentation, reference table and predictive analysis, etc.

The thickness 3328 determines the $\Delta n$ on the HR side 3302, relative to the thermal lens and reduces the guiding ability of the lateral waveguide 3306 in the region proximate HOMSL 3304. In various examples, thicknesses may be selected such that the thermal lens is mostly compensated to generate a weakly index guided region. This enables weak index guiding of a few lateral modes, or, in the extreme case, only a single lateral mode, at high operating current on the HR side 3302. Such a weakly guided region may support 10 or fewer lateral modes or may support only one mode. As a result, the lateral waveguide 3306 at the HR side 3302 supports fewer lateral modes and enables reduction of slow-axis divergence and higher brightness compared to conventional BALs.

Simulations and Examples

HOMSL 3104 and HOMSL 3204, respectively, may be fabricated by a variety of methods known to those of skill in the art and claimed subject matter is not limited in this regard. For manufacturing, it may be necessary to determine a suitable thickness of HOMSL 3104 sufficient to reduce index contrast on the HR side. This relative difference in the $\Delta n$ can be accounted for in a simulation calculation of the relationship between HOMSL 3104 thickness and $\Delta n$.

Figure 34:
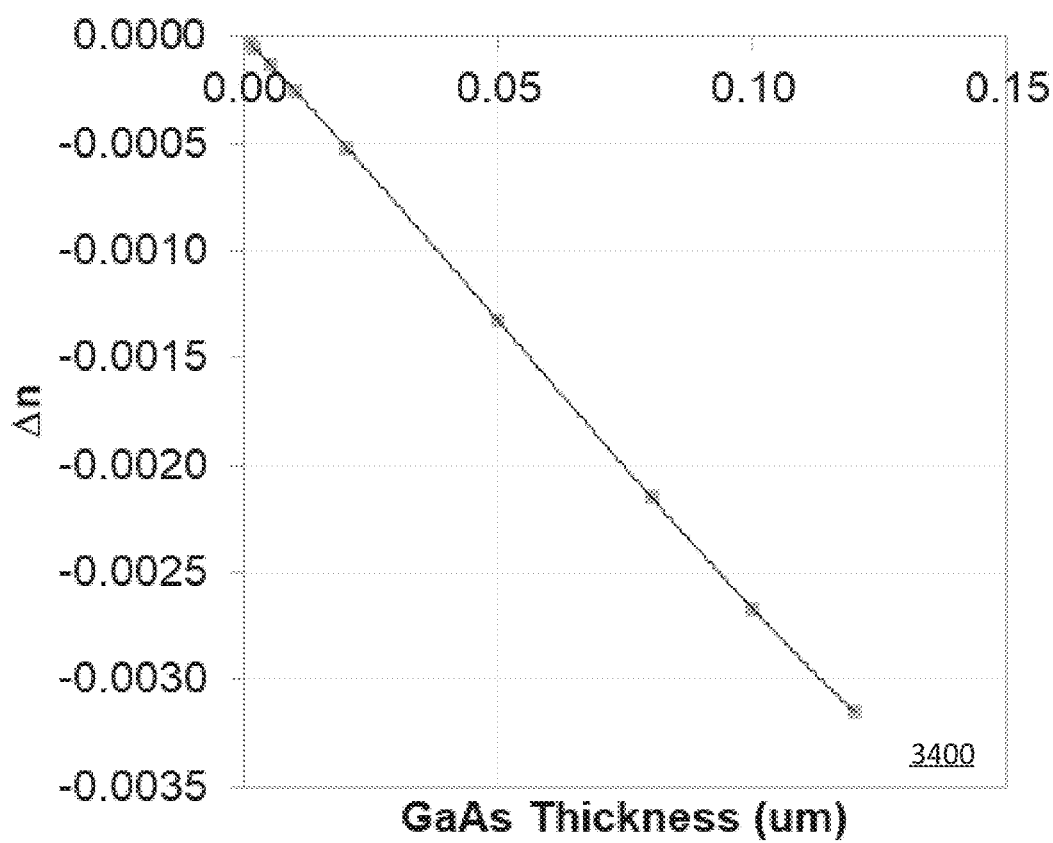
FIG. 34 is an example plot 3400 for approximating an optimized thickness of a higher order mode suppression layer to compensate for a specific delta in the index caused by a thermal lens.

FIG. 34 is a graph 3400 showing a simulation of thickness impact on the $\Delta n$ for approximating an optimized thickness of a buried HOMSL 3104 to compensate for a specific delta in the index caused by a thermal lens. The specific HOMSL 3104 may be made of GaAs and is formed in between the p-type waveguide layer 3116 and the p-type cladding layer 3110 of lower index of refraction than GaAs. A negative Δn means a negative lateral index difference between the lateral waveguide and cladding. Using graph 3400, a HOMSL 3104 thickness is optimized to compensate for a specific delta in the index caused by a thermal lens may be approximated. Although the simulation is specific to the geometric approach shown in FIG. 34, there are other methods to achieve the weakly index guided HR side 3102 of the emitter. These include reducing the transverse waveguide thickness in the active stripe. Both these approaches would achieve a reduced index contrast between the lateral waveguide and the cladding.

The approximate index compensation necessary for the thermal lens is determined by using simulated beam propagation of a waveguide and concurrently simulated far field.

Figure 35:
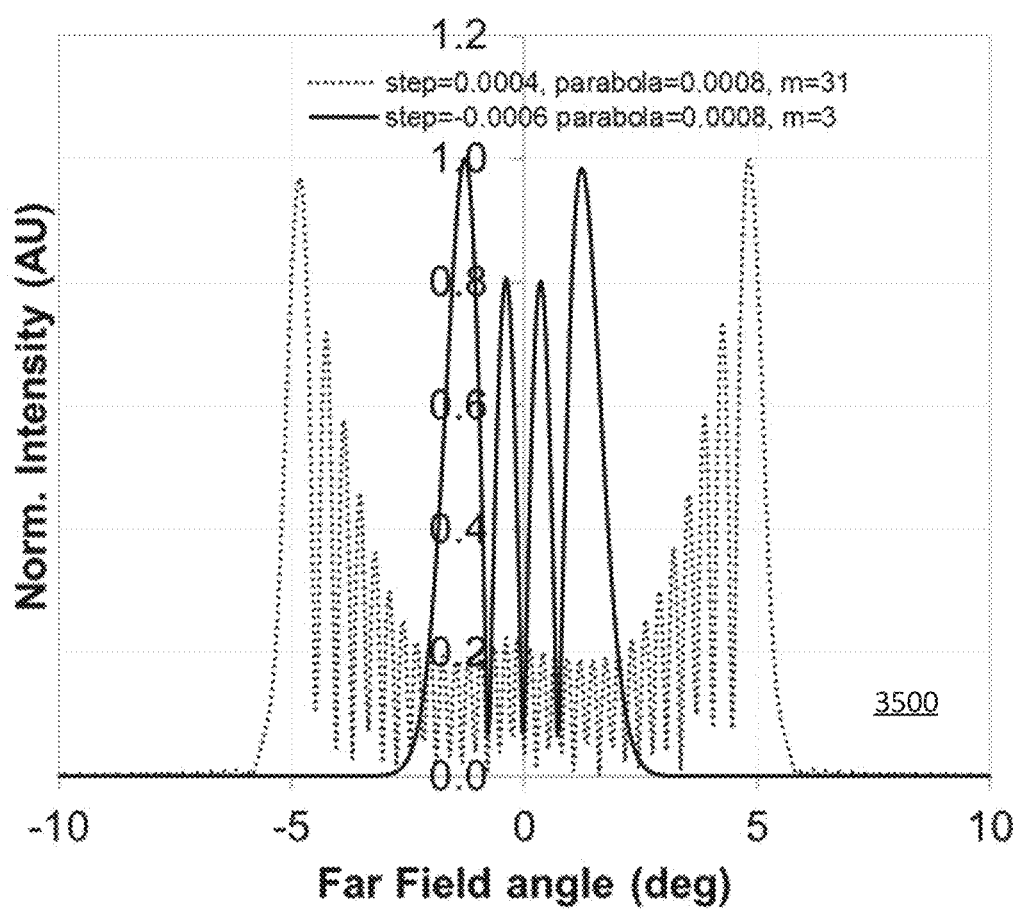
FIG. 35 is a graph 3500 illustrating a simulation predicting example far fields of supported modes with and without higher order mode suppression by thermal lensing compensation.

FIG. 35 is a graph 3500 illustrating a simulation predicting the far fields of supported modes with and without higher order mode suppression by thermal lensing compensation. The specific example is a BAL with 200 um lateral waveguide width and typical step index and thermal lens. The reduction in supported modes implies a reduction in the far field from ~10.9 degrees to ~4.3 degrees. The slow axis far field divergence of a variety of BAL with HOMSL under different step indices and thermal lenses are simulated and summarized in the table below:

| Launch | Waveguide Width um | Δn Index | "Therma" Parabola Index | Total Index | HOM M | Far Field 1/e^2 Degrees |
|---|---|---|---|---|---|---|
| Multimode | 100 | 0.0004 | 0 | 0.0004 | — | 6.7 |
| Highest Order Mode | 100 | 0.0004 | 0.0004 | 0.0008 | 12 | 8.9 |
| Highest Order Mode | 100 | 0.0004 | 0.0004 | 0.0008 | 13 | 9.3 |
| Highest Order Mode | 100 | 0.0004 | 0.0008 | 0.0012 | 15 | 11.2 |
| Highest Order Mode | 100 | 0.0004 | 0.001 | 0.0014 | 16 | 12.3 |
| Highest Order Mode | 100 | −0.001 | 0.0012 | 0.0002 | 1 | 5.2 |
| Highest Order Mode | 100 | −0.0008 | 0.001 | 0.0002 | 1 | 4.85 |
| Multimode | 200 | 0.0004 | 0 | 0.0004 | — | 6.35 |
| Highest Order Mode | 200 | 0.0004 | 0.0004 | 0.0008 | 26 | 9.1 |
| Highest Order Mode | 200 | 0.0004 | 0.0008 | 0.0012 | 31 | 10.9 |
| Highest Order Mode | 200 | 0.0004 | 0.0012 | 0.0016 | 35 | 12.55 |
| Highest Order Mode | 200 | −0.0004 | 0.0012 | 0.0008 | 17 | 9.1 |
| Highest Order Mode | 200 | −0.0008 | 0.0012 | 0.0004 | 7 | 6.3 |
| Highest Order Mode | 200 | −0.0006 | 0.0008 | 0.0002 | 3 | 4.3 |
| Highest Order Mode | 200 | −0.0007 | 0.0008 | 0.0001 | 1 | 3.3 |

As outlined above, a flat index step is used to determine the index contrast necessary to match the far field at low operating power. The HOM column is the order of the highest order mode predicted.

The foregoing descriptions of laser diodes, epitaxial layer structures, various features/structures within the epitaxial layers and waveguides are merely examples and are included for illustrative purposes; other structures and features or combinations of structures and/or features are contemplated and within the scope of the disclosed subject matter and claim subject matter is not limited in this regard.

Having described and illustrated the general and specific principles of examples of the presently disclosed technology, it should be apparent that the examples may be modified in arrangement and detail without departing from such principles. We claim all modifications and variation coming within the spirit and scope of the following claims.

What is claimed is:

1. A laser diode, comprising:
   a transverse waveguide that is orthogonal to the lateral waveguide comprising an active layer between an n-type waveguide layer and a p-type waveguide layer, wherein the transverse waveguide is bounded by an n-type cladding layer on an n-side and p-type cladding layer on a p-side; and
   a lateral waveguide bounded in a longitudinal direction at a first end by a high reflector (HR) coated facet and at a second end by a partial reflector (PR) coated facet, the lateral waveguide further comprising a buried higher order mode suppression layer (HOMSL) disposed beneath the p-cladding within the lateral waveguide or on one or both sides of the lateral waveguide or a combination thereof, wherein the HOMSL extends in a longitudinal direction from the HR facet a length less than the distance between the HR facet and the PR facet.

2. The laser diode of claim 1, wherein the refractive index of the HOMSL disposed on one or both sides of the lateral waveguide is higher than the p-type waveguide layer and the p-cladding layer.

3. The laser diode of claim 1, wherein the refractive index of the HOMSL disposed within the lateral waveguide is lower than the n-type waveguide layer or the p-type waveguide layer or a combination thereof.

4. The laser diode of claim 1, wherein a thickness of the HOMSL is selected based on a magnitude of the refractive index contrast in the lateral waveguide induced by thermal lensing within the lateral waveguide during operation of the laser diode.

5. The laser diode of claim 4, wherein the thickness of the HOMSL is further selected to reduce the magnitude of the refractive index contrast of the lateral waveguide during operation.

6. The laser diode of claim 5, wherein the magnitude of the refractive index contrast is in the range of $10\text{-}5 < \Delta n < 10\text{-}3$.

7. The laser diode of claim 5, wherein the lateral waveguide supports fewer than ten lateral modes.

8. The laser diode of claim 5, wherein the lateral waveguide supports a single lateral mode.

9. The laser diode of claim 1, wherein a thickness of the HOMSL is selected to reduce an effective index on a side of the lateral waveguide extending from the HR facet.

10. The laser diode of claim 1, wherein the HOMSL comprises gallium arsenide (GaAs), aluminum gallium arsenide (AlGaAs), indium gallium arsenide (InGaAs), indium aluminum gallium arsenide (InAlGaAs), indium gallium phosphide (InGaAsP).

11. The laser diode of claim 1, wherein the lateral waveguide is bounded in the lateral direction by a ridge waveguide wherein the ridge waveguide extends from the HR facet to the PR facet.

12. The laser diode of claim 2, wherein the HOMSL laterally overlaps the lateral waveguide by between 0-10 um on either side, or 0-20 um total.

13. The laser diode of claim 3, wherein the HOMSL disposed within the lateral waveguide is narrower laterally than the lateral waveguide by 0-10 um on either side or 0-20 um total.

14. The laser diode of claim 1, wherein the lateral waveguide is bounded in the lateral direction by a ridge waveguide in the longitudinal direction from the PR facet a length less than the distance between the PR facet and the HR facet.

15. The laser diode of claim 1, wherein the transverse waveguide thickness in the active stripe is reduced by either etching down or selectively depositing thicker layers adjacent to an active stripe.

16. The laser diode of claim 1, wherein a thinner low index layer is disposed along the width of the lateral waveguide in a region of the HOMSL.

* * * * *